(12) United States Patent
Maeda et al.

(10) Patent No.: US 9,183,970 B2
(45) Date of Patent: Nov. 10, 2015

(54) COATED HIGH-TEMPERATURE SUPERCONDUCTING WIRE AND HIGH-TEMPERATURE SUPERCONDUCTING COIL INCLUDING THE SAME

(71) Applicants: RIKEN, Saitama (JP); NATIONAL UNIVERSITY CORPORATION CHIBA UNIVERSITY, Chiba (JP); MITSUBISHI CABLE INDUSTRIES, LTD., Tokyo (JP)

(72) Inventors: Hideaki Maeda, Kanagawa (JP); Masato Takahashi, Kanagawa (JP); Yoshinori Yanagisawa, Kanagawa (JP); Hideki Nakagome, Chiba (JP); Keita Oobuchi, Wakayama (JP); Hiroyuki Kamibayashi, Wakayama (JP)

(73) Assignees: RIKEN, Saitama (JP); NATIONAL UNIVERSITY CORPORATION CHIBA UNIVERSITY, Chiba (JP); MITSUBISHI CABLE INDUSTRIES, LTD., Tokyo (JP)

( * ) Notice: Subject to any disclaimer, the term of this patent is extended or adjusted under 35 U.S.C. 154(b) by 262 days.

(21) Appl. No.: 13/658,330

(22) Filed: Oct. 23, 2012

(65) Prior Publication Data

US 2014/0066314 A1    Mar. 6, 2014

(30) Foreign Application Priority Data

Oct. 24, 2011   (JP) ................................ 2011-233405
Apr. 25, 2012   (JP) ................................ 2012-100477

(51) Int. Cl.
*H01B 12/00*    (2006.01)
*H01B 12/02*    (2006.01)
(Continued)

(52) U.S. Cl.
CPC .............. *H01B 12/02* (2013.01); *C08G 73/106* (2013.01); *C09D 179/08* (2013.01); *H01B 3/306* (2013.01);
(Continued)

(58) Field of Classification Search
CPC ................. H01F 5/00; H01F 5/06; H01F 6/00
USPC .................................. 505/211, 123
See application file for complete search history.

(56) References Cited

U.S. PATENT DOCUMENTS 3,974,324 A    8/1976   Lupinski et al.
5,152,880 A   10/1992   O'Toole et al.
(Continued)

FOREIGN PATENT DOCUMENTS

EP    0311337 A2    4/1989
JP    2005-162954 A   6/2005
(Continued)

OTHER PUBLICATIONS

Sakai, N., "Conference Report on ISS2011 (Wire & Application)," *FSST News*, Jan. 18, 2012, No. 132, pp. 12-13, Japan.
(Continued)

*Primary Examiner* — Paul Wartalowicz
(74) *Attorney, Agent, or Firm* — Alston & Bird LLP

(57) ABSTRACT

In a coated high-temperature superconducting wire 1 in which a superconducting yttrium-based wire (high-temperature superconducting wire) 2 having a rectangular cross section is coated by an insulating layer 6, the insulating layer 6 is an electrodeposited film made of block copolymerized polyimide which contains siloxane bonds in a polyimide main chain and which has molecules with anionic groups. A coil formed from the superconducting yttrium-based wire 2 is impregnated with epoxy resin, and the epoxy resin is cured. The coil is configured such that the epoxy resin is completely separated from the superconducting yttrium-based wire 2 by the insulating layer 6.

26 Claims, 9 Drawing Sheets

(51) Int. Cl.
| | |
|---|---|
| C09D 179/08 | (2006.01) |
| C08G 73/10 | (2006.01) |
| H01F 6/06 | (2006.01) |
| H01L 39/14 | (2006.01) |
| H01L 39/24 | (2006.01) |
| H01B 3/30 | (2006.01) |
| H01F 5/06 | (2006.01) |
| H01F 5/00 | (2006.01) |
| H01F 6/00 | (2006.01) |

(52) U.S. Cl.
CPC .............. H01F 6/06 (2013.01); H01L 39/143 (2013.01); H01L 39/247 (2013.01); H01F 5/00 (2013.01); H01F 5/06 (2013.01); H01F 6/00 (2013.01)

(56) References Cited

U.S. PATENT DOCUMENTS

| | | | | |
|---|---|---|---|---|
| 5,384,197 | A * | 1/1995 | Koyama et al. | 428/457 |
| 6,370,405 | B1 * | 4/2002 | Riley et al. | 505/231 |
| 8,530,390 | B2 | 9/2013 | Hilton et al. | |
| 2002/0183208 | A1 * | 12/2002 | Pereira et al. | 505/100 |
| 2004/0266628 | A1 | 12/2004 | Lee et al. | |
| 2008/0257579 | A1 | 10/2008 | Hirose | |
| 2009/0078150 | A1 * | 3/2009 | Hasegawa et al. | 104/286 |
| 2009/0256663 | A1 * | 10/2009 | Hsieh et al. | 335/216 |
| 2010/0108533 | A1 * | 5/2010 | Fujii et al. | 205/317 |
| 2011/0218112 | A1 * | 9/2011 | Ha et al. | 505/230 |
| 2012/0040838 | A1 * | 2/2012 | Damiani et al. | 505/162 |

FOREIGN PATENT DOCUMENTS

| | | | |
|---|---|---|---|
| JP | 4187293 | B2 | 11/2008 |
| JP | 2009/295292 | A | 12/2009 |
| JP | 2011/108918 | A | 6/2011 |
| JP | 2011/138781 | A | 7/2011 |
| JP | 4752744 | B2 | 8/2011 |
| JP | 2012/064495 | A | 3/2012 |
| WO | WO 2008/011184 | A2 | 1/2008 |
| WO | WO 2008/139991 | A1 | 11/2008 |

OTHER PUBLICATIONS

Kawagoe, A., "The 15th Japan-U.S. Workshop on Advanced Superconductors, (4) Large Scale 2," *FSST News*, Jan. 18, 2012, p. 16, No. 132, Japan.

Yanagisawa, Y., et al., "Magnet Technology for YBCO-Coated Conductors," *The Magneto-Science Society of Japan*, 2011, 1 page, Japan.

Yanagisawa, Y., et al., "Effect of Cleavage Stress on the YBCO-Coated Conductor Coil Performance and Remedies for the Effect," *Cryogenics and Superconductivity Society of Japan*, 2011, 3 pages, Japan.

Yanagisawa, Y., et al, "Removal of Degradation of the Performance of an Epoxy Impregnated YBCO-Coated Conductor Double Pancake Coil By Using a Polyimide-Electrodeposited YBCO-Coated Conductor," *Physica C*, Jan. 6, 2012, pp. 19-22, vol. 476, North-Holland Publishing, Amsterdam, NL.

European Patent Office, Extended European Search Report for Application No. 12189570.0, Mar. 21, 2013, 10 pages, Germany.

Novák, I., et al., "Macromolecular Nanotechnology: Surface and Adhesion Properties of Poly(Imide-Siloxane) Block Copolymers", European Polymer Journal, 2009, pp. 57-69, vol. 45, Elsevier Ltd., UK.

Senatore, C., et al., "Progresses and Challenges in the Development of High-Field Solenoidal Magnets Based on RE123 Coated Conductors," Superconductor Science and Technology, 2014, IOP Publishing Ltd, UK.

Yazaki, S., et al., "Characteristic Change in HTSs Due to High-Temperature Heat", Proceedings of Cryogenics and Superconductivity Society of Japan, Nov. 2011, Abstracts of CSJ Conference, p. 137, vol. 85, Japan.

Yazaki, S., et al., "Critical Current Degradation in High-Temperature Superconducting Tapes Caused by Temperature Rise", IEEE Transactions on Applied Superconductivity, Jun. 2013, vol. 23, No. 3, IEEE, USA.

Takematsu, T., et al., "Degradation of the Performance of a YBCO-coated Conductor Double Pancake Coil Due to Epoxy Impregnation," *Physica C*, Apr. 21, 2010, pp. 674-677, vol. 470, Elsevier B.V., Amsterdam.

Yanagisawa, Y., et al., "Remarkable Weakness Against Cleavage Stress for YBCO-coated Conductors and its Effect on the YBCO Coil Performance," *Physica C*, Nov. 29, 2010, pp. 480-485, vol. 471, Elsevier B.V., Amsterdam.

Dalban-Canassy, M., et al., "35.4 T Field Generated Using a Layer-wound Superconducting Coil Made of ReBCO Coated Conductor," *22nd International Conference on Magnetic Technology*, Session 2HP1, Sep. 13, 2011, 1 page, Marseille.

Zhang, Y., et al., "Adhesion Strength Study of IBAD-MOCVD-Based 2G HTS Wire Using a Peel Test," *Physica C*, Nov. 14, 2011, pp. 41-47, vol. 473, Elsevier B.V., Amsterdam.

* cited by examiner

FIG.16

| | Second Example | Third Example | Fourth Example | | | Second Comparative Example | |
|---|---|---|---|---|---|---|---|
| Superconducting Wire | YBCO | Bismuth | YBCO | YBCO | Bismuth | LTS | YBCO | LTS |
| Cross-Sectional Shape | Rectangular | Rectangular | Rectangular with Raised-Recessed Side Surface | Rectangular | Rectangular | Circular | Rectangular | Circular |
| Coating Film Thickness | 20 μm | 20 μm | 10 μm | 5 μm, 10 μm, and 20 μm | 20 μm | 10 μm | 30 μm | 30 μm |
| Electrical Insulating Film | Formed by Electrodeposition of Polyimide Containing Siloxane Bonds | Formed by Electrodeposition of Polyimide Containing Siloxane Bonds | Formed by Electrodeposition of Polyimide Containing Siloxane Bonds | Formed by Electrodeposition of Polyimide Containing Siloxane Bonds | Formed by Electrodeposition of Polyimide Containing Siloxane Bonds | Formed by Electrodeposition of Polyimide Containing Siloxane Bonds | Formed by Dip Coating of Polyamide-imide Varnish | Formed by Dip Coating of Polyamide-imide Varnish |
| Baking | Performed | Performed | Performed | Performed | Performed | Performed | Performed | Performed |
| Impregnation | Not Performed | Not Performed | Not Performed | Not Performed | Not Performed | Not Performed | Not Performed | Not Performed |
| Electrical Insulation Performance | Good | Good | Good | Good | Good | Good | Not Good | Good |

FIG. 17

| | Fifth Example | | Third Comparative Example | | | | Sixth Example | |
|---|---|---|---|---|---|---|---|---|
| Superconducting Wire | YBCO | Bismuth | YBCO | Bismuth | YBCO | Bismuth | YBCO | Bismuth |
| Cross-Sectional Shape | Rectangular | Rectangular | Rectangular | Rectangular | Rectangular | Rectangular | Rectangular | Rectangular |
| Electrical Insulating Film | Formed by Electrodeposition of Polyimide Containing Siloxane Bonds | Formed by Electrodeposition of Polyimide Containing Siloxane Bonds | Formed by Electrodeposition of Polyimide Containing No Siloxane Bond | Formed by Electrodeposition of Polyimide Containing No Siloxane Bond | No Film Formed | No Film Formed | Formed by Electrodeposition of Polyimide Containing Siloxane Bonds | Formed by Electrodeposition of Polyimide Containing Siloxane Bonds |
| Baking | Performed | Performed | Performed | Performed | Not Performed | Not Performed | Performed | Performed |
| Impregnation | Performed | Performed | Performed | Performed | Performed | Performed | Performed | Performed |
| Test | Cleavage Test | Cleavage Test | Cleavage Test | Cleavage Test | Cleavage Test | Cleavage Test | Tensile Test | Tensile Test |
| Superconducting Properties | Good | Good | Not Good | Not Good | Not Good | Not Good | Good | Good |

FIG. 18

| | Fourth Comparative Example | | | | Seventh Example | Eighth Example |
|---|---|---|---|---|---|---|
| Superconducting Wire | YBCO | Bismuth | YBCO | Bismuth | Bismuth | YBCO |
| Cross-Sectional Shape | Rectangular | Rectangular | Rectangular | Rectangular | Coil | Coil |
| Electrical Insulating Film | Formed by Electrodeposition of Polyimide Containing No Siloxane Bond | Formed by Electrodeposition of Polyimide Containing No Siloxane Bond | Formed by Electrodeposition of Acrylic | No Film Formed | Formed by Electrodeposition of Polyimide Containing Siloxane Bonds | Formed by Electrodeposition of Polyimide Containing Siloxane Bonds |
| Baking | Performed | Not Performed | Performed | Not Performed | Performed | Performed |
| Impregnation | Performed | Performed | Performed | Performed | Performed | Performed |
| Test | Tensile Test | Tensile Test | Tensile Test | Tensile Test | - | - |
| Superconducting Properties | Not Good | Not Good | Not Good | Not Good | Good | Good |

COATED HIGH-TEMPERATURE SUPERCONDUCTING WIRE AND HIGH-TEMPERATURE SUPERCONDUCTING COIL INCLUDING THE SAME

CROSS-REFERENCE TO RELATED APPLICATION

This application is based upon and claims the benefit of priority from Japanese Patent Application No. 2011-233405, filed on Oct. 24, 2011, and Japanese Patent Application No. 2012-100477, filed on Apr. 25, 2012, the entire contents of both which are incorporated herein by reference in their entirety.

BACKGROUND

The present disclosure relates to a coated high-temperature superconducting wire using a high-temperature superconducting wire and to a high-temperature superconducting coil including the coated high-temperature superconducting wire.

As in Japanese Patent No. 4187293, Japanese Patent No. 4752744, and Japanese Patent Publication No. 2011-108918, a high-temperature superconducting coil using an oxide superconductor has been conventionally known. Among high-temperature superconducting wires, a rare-earth-based (ReBCO) wire called a "second-generation wire" has the following characteristics: a smaller thickness than that of a first-generation high-temperature superconducting wire (bismuth-based wire); excellent strength in a longitudinal direction; a great high-magnetic-field critical current density in engineering; and excellent electrical conductivity. For, e.g., a nuclear magnetic resonance (NMR) magnet used in an extremely-high magnetic field, the high-temperature superconducting wire is more advantageous as compared to a conventional low-temperature superconducting wire. A value for hoop stress generated on the high-temperature superconducting coil by electromagnetic force is obtained by the following expression: Magnetic Field Value×Current Density×Radius. Since mechanical strength in the longitudinal direction (lengthwise direction) is high, a current density can be high. This allows significant reduction in size of the high-temperature superconducting coil. As a result, e.g., the following can be realized: easing of installation conditions; reduction in amount of helium to be consumed; and reduction in material cost.

The high-temperature superconducting wire is extremely susceptible to bending. If the high-temperature superconducting wire is curved, bent, or twisted so as to have a bending diameter equal to or less than the minimum allowable bending diameter at which superconducting performance is not degraded, the superconducting performance is irreversibly degraded. For such a reason, in order not to cause the bending in a fabricating process, careful processing is required. In addition, the high-temperature superconducting wire is more susceptible to stress in a transverse direction as compared to a typical copper wire, and therefore the superconducting performance is irreversibly degraded due to the stress in the transverse direction. Further, the performance of the high-temperature superconducting wire is degraded due to exposure to a high temperature of equal to or higher than about 250° C. for a long period of time. A series of the following steps is performed one time or several times as a method for electrically insulating the high-temperature superconducting wire: a coating material (e.g., formal resin coating, polyester resin coating, polyamide-imide resin coating, and polyimide resin coating) for an enamel wire is applied to an outer surface of the wire, or the wire is dipped in the coating material; and the coating material is baked on the wire. Alternatively, an insulating tape such as a polyimide tape may be wound around the outer periphery of the superconducting wire.

SUMMARY

In the case where the ReBCO wire is wound in a coil shape to form the high-temperature superconducting coil, the coil is hardened in order to maintain the strength of the coil. Typically, the following method has been broadly employed: the high-temperature superconducting coil formed by winding the ReBCO wire around a reel is impregnated with an impregnation material such as epoxy resin, and the high-temperature superconducting wire is, together with the reel, hardened by heating and curing of the impregnation material. However, in such a method, there is a disadvantage that superconducting properties of the coil are degraded (see, e.g., Takamatsu T et al., Physica C 470, 674-677 (2010), and Yanagisawa Y et al., Physica C 471, 480-485 (2011)). A reason for such degradation is as follows. The ReBCO wire is a type of complex including a plurality of layers (e.g., a stabilization layer, a superconducting layer, an intermediate layer, and a metal substrate). Thus, the ReBCO wire is extremely susceptible to tensile stress in a thickness direction thereof and "cleavage stress" caused due to stress concentration on end parts of the wire in a width direction thereof, and is mechanically damaged inside the coil due to, e.g., stress caused upon impregnation and curing of epoxy resin, thermal stress, and electromagnetic stress. As a result, the layers forming the complex are detached from each other (such a state is hereinafter referred to as "delamination"). The stress of this type is caused because the coil is impregnated with hard strong epoxy resin and therefore the epoxy resin provides great force to the ReBCO wire provided inside the coil.

Various attempts have been made to overcome the foregoing disadvantages caused due to the impregnation with epoxy resin.

For example, the following method (see Japanese Patent No. 4187293 and Japanese Patent No. 4752744) has been proposed: a high-temperature superconducting wire is wound in the state in which an adhesive layer such as a prepreg tape is stacked on the high-temperature superconducting wire, and the prepreg tape is cured to harden the high-temperature superconducting wire. However, in such a method, since the high-temperature superconducting wire is hardened by epoxy resin, there is a disadvantage that it is difficult to reduce degradation of superconducting properties.

In addition, the following method (see Japanese Patent Publication No. 2011-108918) for fabricating the high-temperature superconducting coil has been proposed: a non-adhesive insulating layer such as a polyimide tape is interposed between a high-temperature superconducting wire and an adhesive layer such as a prepreg tape such that the high-temperature superconducting wire is not directly hardened by epoxy resin of the adhesive layer. However, in such a method, it is difficult to prevent hardening of the high-temperature superconducting wire by epoxy resin impregnating the insulating layer. In such a case, since the high-temperature superconducting wire is directly hardened by epoxy resin, there is a disadvantage that it is difficult to reduce degradation of superconducting properties. Further, in this method, there is another disadvantage that vacuum pressure impregnation by which the highest strength can be obtained cannot be employed.

In order to fabricate the coil by epoxy impregnation, the following method has been proposed: a heat-shrinkable polymer tube is shrunk with a ReBCO wire being placed in the polymer tube, and the polymer tube is impregnated with epoxy resin (see M. Dalban-Canassy et al., 22$^{nd}$ International Conference on Magnet Technology held in Marseille, France, 11-16 Sep. 2011). In such a method, since hard epoxy resin contacts the ReBCO wire through the tube, and the tube and the ReBCO wire are not bonded together, it is less likely to damage the wire. However, it is difficult to prepare, for this method, a long, seamless, uniform ReBCO wire accommodated in the heat-shrinkable tube. Although the foregoing method can be employed for a small coil formed from a short length of wire, there is a disadvantage in employment for a large coil. In addition, since the impregnation is limited to coating type impregnation, there are disadvantages in extensibility and mechanical coil strength.

In order to fabricate, e.g., a pancake coil by epoxy impregnation, the following methods have been conventionally employed: the method in which a ReBCO wire is, for electrical insulation, wound together with an insulating tape such as a polyimide tape (i.e., simultaneously wound with the insulating tape); and the method in which a ReBCO wire bonded to a polyimide tape having an adhesive surface is wound. In such methods, the ReBCO wire is impregnated with an impregnation material such as epoxy resin mainly at end parts of the ReBCO wire in a width direction thereof. Thus, there is a disadvantage that the ReBCO wire provided inside the coil is mechanically damaged due to, e.g., stress caused upon impregnation and curing of epoxy resin, thermal stress, and electromagnetic stress (see, e.g., Yanagisawa Y et al., Physica C 471, 480-485 (2011)).

The method in which an insulating tape such as a polyimide tape having no adhesive layer or an insulating tape such as a polyimide tape having an adhesive layer or a bonding layer is spirally wound around a wire itself has been conventionally employed as the method for electrically insulating the ReBCO wire. Upon the winding, the following methods are employed: the method in which the polyimide tape is wound so as not to form an overlap; and the method in which the polyimide tape is wound so as to form an overlap(s). In the case where the insulating tape such as the polyimide tape having the adhesive layer or the bonding layer is wound so as to form the overlap(s), there is a disadvantage that, when the thickness of the ReBCO wire is, e.g., about 0.1 mm, the thickness of the electrical insulating layer is 0.1 mm on one side of the ReBCO wire. When the high-temperature superconducting coil is fabricated, it is important to consider magnetic field generation efficiency, i.e., efficiency for generating a magnetic field having a high current density corresponding to the cross-sectional area of the high-temperature superconducting coil including the electrical insulating layer, and therefore the thick electrical insulating layer is not suitable. In addition, since the adhesive layer or the bonding layer is made of, e.g., silicon curable by cooling, disadvantages similar to those caused due to epoxy impregnation are caused. In the case where the insulating tape such as the polyimide tape having no adhesive layer is wound, a clearance is formed between adjacent ones of turns of the polyimide tape. Thus, when the high-temperature superconducting coil is fabricated, the impregnation material enters the clearance upon impregnation such as vacuum pressure impregnation, and therefore the following disadvantage is caused: the ReBCO wire provided inside the coil is mechanically damaged due to, e.g., stress caused upon impregnation and curing of hard strong epoxy resin, thermal stress, and electromagnetic stress.

There are other disadvantages to be overcome other than the disadvantages caused due to epoxy impregnation.

In order to obtain a high critical current density by enhancing orientation of oxide superconducting crystals, a thin flat tape-shaped wire is used as the ReBCO wire. A typical wire has a width of about 3-12 mm and a thickness of about 0.055-0.15 mm. In a conventional low-temperature superconducting wire, an insulating coating film made of, e.g., formal is formed on an outer surface of the wire by repeating dipping and baking. Such a method can be easily assumed on the analogy of the prior art. However, if a tape-shaped wire having an aspect ratio of at least 10 or more, such as the ReBCO wire, is coated by the method of this type, there is a disadvantage that flat parts of the wire can be coated, but corner parts of the wire cannot be sufficiently coated. In such a case, when the wire is wound in a coil shape, there is a possibility that short-circuit occurs. Conversely, if the thickness of the coating film at the corner parts of the wire is increased, there is a disadvantage that the thickness of the coating film is greater than the thickness of the superconducting wire.

There are still other disadvantages to be overcome in the case where the ReBCO wire is applied for products other than the high-temperature superconducting coil.

The ReBCO wire is a type of complex including a plurality of layers (e.g., a stabilization layer, a superconducting layer, an intermediate layer, and a metal substrate). Thus, the ReBCO wire is extremely susceptible to tensile stress in the thickness direction thereof and "cleavage stress" caused due to stress concentration on the end parts of the wire in the width direction thereof. For such a reason, for hardening the high-temperature superconducting wire such as the ReBCO wire having the foregoing structure, a structure or a hardening method (e.g., impregnation or bonding using epoxy resin) in which cleavage stress acts on the wire cannot be used. Cleavage stress is caused due to, e.g., stress caused upon impregnation and curing of epoxy resin, thermal stress, electromagnetic stress, and stress caused upon structure deformation caused by external force. For example, a high-temperature superconducting cable used for, e.g., superconducting power transmission has the following structure: a superconducting wire is spirally wound around a center conductor called "former" so as to form layers stacked on each other, and an electrical insulating film is wound around and is pressed against the superconducting wire (see, e.g., Japanese Patent Publication No. 2011-138781). The superconducting layer of the high-temperature superconducting wire such as the ReBCO wire is extremely brittle, and is made of, e.g., ceramic. For such a reason, the allowable bending diameter etc. are specified. For example, the allowable bending diameter of the ReBCO wire is about 30 mm. Thus, there is a disadvantage that the wire is bend so as not to reach a diameter equal to or less than the allowable bending diameter, and a structure for holding the wire and a method for hardening the wire are limited.

The high-temperature superconducting cable used for, e.g., superconducting power transmission is configured such that the superconducting wire is spirally wound around the former so as to form the layers stacked on each other. A film (polypropylene laminated paper (PPLP)) formed by sandwiching a polypropylene film between other films and liquid nitrogen circulating for cooling are used for the electrical insulating film wound around the superconducting wire. The PPLP is wound around the cable formed by winding the superconducting wire around the former, and there is a risk of breaking the wound PPLP when the cable is curved. For such a reason, when the PPLP is spirally wound, a clearance is required to be formed between adjacent ones of turns of the PPLP such that edges of the PPLP do not contact each other in the wound state of the PPLP. However, since insulation performance in the clearance is lower than that in other part, there is a possibility that partial discharge occurs. As a result, there is a disadvantage that, e.g., reduction in dielectric strength and a power transmission loss occur.

For the high-temperature superconducting cable used for superconducting power transmission, the following method (see, e.g., Japanese Patent Publication No. 2009-295292) has been conventionally employed as an electrical insulation method: an insulating tape such as a polyimide tape having no adhesive layer or an insulating tape such as a polyimide tape having an adhesive layer or a bonding layer is spirally wound around a wire itself. However, if a clearance is formed between adjacent ones of turns of the polyimide tape, a disadvantage in insulation performance similar to the foregoing disadvantage in insulation performance in the clearance is caused. If there is no clearance between adjacent ones of the turns of the polyimide tape, the thickness of the electrical insulating layer varies with location due to lap winding of the tape, or materials having different permittivity and insulation performance, such as the polyimide tape and the adhesive layer, are stacked on each other such that the total thickness of such materials varies with location. Thus, there is a disadvantage that partial discharge is likely to occur in some part of the high-temperature superconducting cable.

Since a temperature required for baking the coating material (e.g., formal resin coating) for the enamel wire is a high temperature of about 250-700° C., there is a disadvantage that the superconducting properties of the superconducting wire are degraded. In a method for winding an insulating tape, there is a disadvantage that a thick insulating tape results in a larger outer diameter or a larger thickness of the superconducting wire. In addition, as in the case where the thickness of the insulating coating film made of the coating material (e.g., formal resin coating) for the enamel wire is decreased at, e.g., the corner part of the superconducting wire depending on a cross-sectional shape thereof, the thickness of the coating film cannot be selected for each location. Further, if an insulating coating film is formed on a long wire, the thickness of the coating film varies in a longitudinal direction of the wire. As in the foregoing cases, the thickness of the coating film cannot be precisely controlled. For such reasons, a disadvantage that there is a limitation due to the length, thickness, width, cross-sectional structure, and cross-sectional shape of the superconducting wire is caused.

The ReBCO wire is a type of complex including a plurality of layers (e.g., a stabilization layer, a superconducting layer, an intermediate layer, and a metal substrate). That is, the ReBCO wire is a complex material of a multilayer thin film of a ceramics and a metal tape. There is a disadvantage that, when the ReBCO wire is used in a cooled state, layers of the ReBCO wire are detached from each other due to a difference in heat shrinkage rate between the multilayer thin film and the metal tape. As a method for overcoming such a disadvantage, Japanese Patent Publication No. 2012-064495 describes that polyimide is used so that the components of the complex material remain joined together. However, as in Takematsu T et al., Physica C 470, 674-677 (2010) and Y. Zhang et al., Physica C 473, 41-47 (2012), improvement has been recently made in the disadvantage of the ReBCO wire described in Japanese Patent Publication No. 2012-064495, i.e., the disadvantage that delamination occurs only by cooling. Thus, the performance of the ReBCO wire is not degraded in a non-impregnated coil and a paraffin-impregnated coil. According to Takematsu T et al., Physica C 470, 674-677 (2010) and Y. Zhang et al., Physica C 473, 41-47 (2012), the performance of the ReBCO wire is degraded only when the ReBCO wire is impregnated with an impregnation material having a relatively-high strength, such as epoxy resin.

The present disclosure has been made in view of the foregoing, and it is an objective of the present disclosure to reduce or prevent delamination of a superconducting wire of a high-temperature superconducting coil to obtain stable superconducting properties and to obtain strong mechanical properties and high electrical insulating properties in, e.g., a superconducting power transmission cable.

In view of the foregoing, the present inventors have conducted various study. As a result, the following was found. An insulating layer made of block copolymerized polyimide containing siloxane bonds in a polyimide main chain is electrodeposited. Thus, it is ensured that, even if the ReBCO wire is impregnated with epoxy resin, intrinsic superconducting properties thereof can be maintained, and that mechanical damage and coil property degradation can be reduced or prevented. In Japanese Patent Publication No. 2011-108918, the polyimide tape is used. However, the polyimide tape having a high cross-linking ratio and the polyimide of the present disclosure having a low cross-linking ratio are essentially different from each other. There is no precedent for use of the wire of the present disclosure including the electrodeposited film made of polyimide at an ultralow temperature of equal to or lower than about 90 K, and it is unclear whether or not the electrodeposited film made of polyimide has low-temperature properties. Thus, the inventors cannot arrive at their findings based on matters which have been already known to the public.

In view of the foregoing, the present inventors have further conducted various study. As a result, the following was found. In the superconducting wire configured such that the insulating layer made of block copolymerized polyimide containing siloxane bonds in the polyimide main chain is electrodeposited, a thin insulating film can uniformly coat part or all of the superconducting wire regardless of, e.g., the length of the superconducting wire, and adhesion of the insulating film to the superconducting wire can be increased. This improves the stiffness of the superconducting wire, and therefore good handleability and high superconducting performance can be realized. According to the present disclosure, similar advantages can be realized in superconducting wires such as high-temperature superconducting wire (e.g., bismuth-based oxide high-temperature superconducting wires and iron-based high-temperature superconducting wires) and low-temperature superconducting wires. Such wires can be used to fabricate, e.g., superconducting coils, superconducting cables, superconducting current leads, and superconducting current limiter. In the present specification, the "low-temperature superconducting wire" is a wire made of a metal-based superconductor material typically having a critical temperature (Tc) of equal to or lower than about 25 K in a non-magnetic field, and examples of the "low-temperature superconducting wire" include a wire made of NbTi, Nb3Sn, Nb3Al, or V3Ga.

In the present specification, the "high-temperature superconducting wire" is a wire made of a superconductor material typically having a critical temperature (Tc) of equal to or higher than about 25 K in a non-magnetic field, and all of wires each made of a copper-based oxide superconductor or an iron-based superconductor are the high-temperature superconducting wires. For example, the following wires are the high-temperature superconducting wires: wires each made of a yttrium-based superconductor or a bismuth-based superconductor; wires each made of a material represented by a chemical formula $YBa_2Cu_3O_{7-\delta}$; wires each made of $ReBa_2Cu_3O_{7-\delta}$ in which an element "Y" in the foregoing chemical formula is substituted with "Re" indicating a rareearth-based element; and wires each made of $Bi_2Sr_2Ca_{n-1}Cu_nO_{4+2n-\delta}$ including $Bi_2Sr_2CaCu_2O_8+\delta(Bi2212)$ or $Bi_2Sr_2Ca_2Cu_3O_{10+\delta}$ (Bi2223). Wires each formed from any of the foregoing wires in the following manners are also considered as the high-temperature superconducting wires: by improving critical current properties of any of the foregoing wires by depositing oxide nanoparticles (e.g., zirconium oxide nanoparticles and dysprosium oxide nanoparticles) on the wire; and by substituting part of elements of any of the foregoing wires with another element. Of the metal-based superconductors, wires each made of, e.g., $MgB_2$ having a superconducting transition temperature of about 25 K or more is the high-temperature superconducting wires.

In the present specification, the "ReBCO wire" is a high-temperature superconducting wire made of at least one selected from a group consisting of rare-earth-based materials and copper oxide-based materials. For example, a wire made only of yttrium is represented by a chemical formula $YBa_2Cu_3O_{7-\delta}$. Examples of such a wire include a superconducting yttrium-based wire having critical current properties improved by depositing oxide nanoparticles (e.g., zirconium oxide nanoparticles and dysprosium oxide nanoparticles) on the wire.

In the present specification, the "superconducting yttrium-based wire" is a high-temperature superconducting wire containing at least yttrium and made of one or more of rare-earth-based materials and copper oxide-based materials. Examples of such a wire include a superconducting yttrium-based wire having critical current properties improved by depositing oxide nanoparticles (e.g., zirconium oxide nanoparticles and dysprosium oxide nanoparticles) on the wire.

In the present specification, the "tape-shaped substrate" is made of, e.g., various metal materials such as nickel and a nickel alloy.

In the present specification, the "intermediate layer" has either a single-layer structure or a multilayer structure, and is made of a metal oxide such as YSZ, MgO, $CeO_2$, $Y_2O_3$, NiO, $BaZrO_3$, $SrTiO_3$, and $Gd_2O_3$.

In the present specification, the "stabilization layer" is made of a metal material having good conductivity, such as silver and copper. The stabilization layer may be stacked on a protective layer made of silver, gold, or an alloy thereof, and it is preferable that a stabilization layer made of copper is stacked on a protective layer made of silver.

In the present specification, the "impregnation material" is adhesive used for hardening of the superconducting wire, and examples of the impregnation material include curable resin (e.g., photocurable resin, ultraviolet curable resin, and electron beam curable resin) such as epoxy resin and phenol resin, thermoplastic resin, paraffin, paraffin wax, wax, grease, and varnish. Any of the foregoing impregnation materials may contain a filler added for the purpose of adjusting, e.g., a heat shrinkage amount. The present disclosure is also intended for an impregnation material contained in prepreg which is a sheet-shaped material containing one or more of the foregoing impregnation materials and which is curable after the prepreg is formed in a sheet shape.

Specifically, a first aspect of the present disclosure is intended for a coated high-temperature superconducting wire including a high-temperature superconducting wire covered by an insulating layer. The high-temperature superconducting wire has a rectangular cross section, and the insulating layer is an electrodeposited film made of polyimide.

Conventionally, a coated high-temperature superconducting wire having an aspect ratio of 10 or more and having a rectangular cross section is formed by dip-coating a high-temperature superconducting wire with an insulator, and is wound into a coil. Then, the coil is impregnated with an impregnation material such as epoxy resin. However, since the aspect ratio of the coated high-temperature superconducting wire is high, an insulating coating film cannot be uniformly formed by dip-coating. Thus, the following disadvantages arise: insulating properties of the coil are not good enough; and the coating film is detached or cracked upon winding of the coated wire into the coil. However, according to the foregoing configuration, the coating film is formed by electrodeposition. Thus, the wire can be coated without causing delamination in the coated high-temperature superconducting wire at a large bending radius. In addition, even if the aspect ratio is high, the wire can be uniformly coated. Further, since the coated high-temperature superconducting wire has flexibility, the coating film is not detached or cracked upon winding of the coated wire into the coil.

Since an electrodeposited film made of block copolymerized polyimide which contains siloxane bonds in a polyimide main chain and which has molecules with anionic groups has excellent flexibility, the electrodeposited film has a function to automatically eliminate, before the high-temperature superconducting wire which is extremely susceptible to cleavage stress is broken, a stress concentrated part by being elastically deformed. This brings about an effect to protect the superconducting wire from various external force (e.g., cleavage stress) breaking the superconducting wire. In addition, the electrodeposited film functions as a cushion when the coated high-temperature superconducting wires or the coated high-temperature superconducting wire and another structure come into contact with each other. The insulating coating film is made of polyimide having excellent electrical insulation performance, and even a long wire can be seamlessly and uniformly coated by the electrodeposited film. This brings about an effect to reduce or prevent partial discharge. The flexibility of electrodeposited polyimide brings about an effect to reduce or prevent breakage of the insulating coating film and the superconducting wire and an effect to form the insulating coating film without gaps even if the coated wire is curved at a room temperature or a low temperature. The adhesion of the electrodeposited film brings about an effect to reduce or prevent degradation of insulation performance due to detachment of the insulating coating film and an effect to reduce or prevent breakage of the coating film when, e.g., stress caused upon impregnation and curing of the impregnation material, thermal stress, electromagnetic stress, or stress caused upon deformation of the structure due to external force is applied, when the coated wire is curved, or when the coated wire is carelessly handled. In addition, the adhesion brings about a cooling effect uniformly and efficiently across the coated superconducting wire because high heat conductivity is obtained upon cooling of the superconducting wire through the insulating coating film. Since the electrodeposited film made of polyimide has high heat resistance, an effect to reduce or prevent burnout upon quenching or upon an accident such as insulation breakdown is brought about. The foregoing features bring about an excellent effect for, e.g., a superconducting coil, a superconducting cable, a superconducting current lead, and a superconducting current limiter used for purposes requiring good electrical insulating properties, good flexibility of the insulating coating film at a room temperature or a low temperature, and good adhesion of the insulating coating film.

For example, in the case where the present disclosure is applied to a superconducting cable used for superconducting power transmission, the foregoing advantages can be obtained by the electrodeposited film, and even a long wire can be seamlessly and uniformly coated by the electrodeposited film having flexibility. Thus, it is not necessary that a butt gap is formed as in the case where the PPLP is used. This reduces or eliminates part of the superconducting cable where partial discharge is likely to occur. In the case where the polyimide tape is spirally wound, there is a disadvantage that partial discharge is likely to occur in part of the superconducting cable for, e.g., the following reasons: a clearance is formed between adjacent ones of turns of the insulating layer; the thickness of the electrical insulating layer varies with location; and materials having different permittivity and insulation performance, such as the polyimide tape and the adhesive layer, are stacked on each other such that the total thickness of such materials varies with location. However, in the insulating layer (i.e., the electrodeposited film), part of the superconducting cable where partial discharge is likely to occur can be reduced or eliminated because of the following features: the insulating layer can be formed without clearances, the thickness and performance of the insulating layer do not vary; the thick insulating layer can be formed in end parts of the wire in a width direction thereof, i.e., in part of the wire where insulation breakdown is likely to occur.

A second aspect of the present disclosure is intended for the coated high-temperature superconducting wire of the first aspect of the present disclosure, in which the insulating layer is an electrodeposited film made of block copolymerized polyimide containing a siloxane bond in a polyimide main chain and having a molecule with an anionic group.

According to the foregoing configuration, since wettability of the coating film is low due to an effect of siloxane, adhesion of the coating film to, e.g., the impregnation material is low. Thus, even if the coated high-temperature superconducting wire is hardened by, e.g., the impregnation material, mechanical damage of the coated high-temperature superconducting wire is not caused.

A third aspect of the present disclosure is intended for the coated high-temperature superconducting wire of the first or second aspect of the present disclosure, in which the high-temperature superconducting wire is a ReBCO wire.

That is, the ReBCO wire is extremely susceptible to tensile stress in a thickness direction of the ReBCO wire and cleavage stress applied to end parts of the ReBCO wire in a width direction thereof. Due to, e.g., "cleavage stress" caused due to stress concentration (e.g., concentration of stress caused upon impregnation and curing of the impregnation material such as epoxy resin, thermal stress, and electromagnetic stress) on the end parts of the ReBCO wire in the width direction thereof, it is likely that the ReBCO wire inside the coil is mechanically damaged and delamination occurs. However, according to the foregoing configuration, since the electrodeposited insulating layer made of polyimide covers part or all of the outer periphery of the ReBCO wire including the corner parts thereof, the flexible low-strength insulating layer can block force transmission between the impregnation material and the ReBCO wire. Thus, it is ensured that delamination of the ReBCO wire is reduced or prevented.

A fourth aspect of the present disclosure is intended for the coated high-temperature superconducting wire of any one of the first to third aspects of the present disclosure, in which the insulating layer substantially uniformly covers part or all of an outer periphery of the high-temperature superconducting wire including a corner part thereof.

According to the foregoing configuration, since the insulating layer substantially uniformly covers part or all of the outer periphery of the ReBCO wire including the corner parts thereof, the flexible low-strength insulating layer can block force transmission between the impregnation material and the ReBCO wire. Thus, it is further ensured that delamination of the ReBCO wire is reduced or prevented.

The insulating coating film can substantially uniformly cover part or all of the ReBCO wire including the corner parts thereof by electrodeposition. This brings about an effect to protect the corner parts of the ReBCO wire where discharge is likely to occur. Such a feature can bring about an excellent effect for, e.g., a superconducting cable, a superconducting current lead, and a superconducting current limiter used for superconducting power transmission.

A fifth aspect of the present disclosure is intended for the coated high-temperature superconducting wire of any one of the first to fourth aspects of the present disclosure, in which the high-temperature superconducting wire is a multilayer structure in which an oxide high-temperature superconducting layer is formed on a tape-shaped metal substrate with an intermediate layer being interposed therebetween, and a stabilization layer is formed on the oxide high-temperature superconducting layer.

According to the foregoing configuration, a high-temperature superconducting wire including, e.g., a yttrium-based superconductor is a wire including a superconductor having a transition temperature exceeding a liquid nitrogen temperature, and is advantageous to generation of a strong magnetic field. Since the high-temperature superconducting wire includes a plurality of layers, the high-temperature superconducting wire is susceptible to delamination. According to the foregoing configuration, since the insulating layer substantially uniformly covers part or all of the outer periphery of the high-temperature superconducting wire including the corner parts thereof, the flexible low-strength insulating layer can block force transmission between the impregnation material and the high-temperature superconducting wire. Thus, it is ensured that delamination of the high-temperature superconducting wire is reduced or prevented.

A sixth aspect of the present disclosure is intended for the coated high-temperature superconducting wire of the fifth aspect of the present disclosure, in which the tape-shaped metal substrate is made of nickel or a nickel alloy.

According to the foregoing configuration, the high-temperature superconducting wire has flexibility and strength.

A seventh aspect of the present disclosure is intended for the coated high-temperature superconducting wire of the fifth or sixth aspect of the present disclosure, in which the stabilization layer is a silver layer.

An eighth aspect of the present disclosure is intended for the coated high-temperature superconducting wire of the fifth or sixth aspect of the present disclosure, in which the stabilization layer is formed by stacking a copper layer on a silver layer.

The foregoing configurations bring about an effect to protect the oxide high-temperature superconducting layer, an effect to diffuse locally-generated heat, and a current bypass effect upon coil quenching.

A ninth aspect of the present disclosure is intended for a high-temperature superconducting coil including the coated high-temperature superconducting wire of any one of the first to eighth aspects of the present disclosure.

According to the foregoing configuration, the effect of the flexible electrodeposited film made of polyimide ensures high superconducting properties without detachment or cracking of the coating film of the coated high-temperature superconducting wire upon winding of the high-temperature superconducting wire into the coil.

A tenth aspect of the present disclosure is intended for the high-temperature superconducting coil of the ninth aspect of the present disclosure, in which the coated high-temperature superconducting wire is wound inside or outside a reel having a predetermined shape, or is wound along a groove of the reel.

According to the foregoing configuration, a method for winding the coated high-temperature superconducting wire is not limited. The foregoing configuration brings about the effect of the flexible electrodeposited film made of polyimide.

An eleventh aspect of the present disclosure is intended for the high-temperature superconducting coil of the tenth aspect of the present disclosure, in which the coated high-temperature superconducting wire is wound inside or outside a cylindrical reel, or is wound along a groove of the cylindrical reel.

According to the foregoing configuration, the coated high-temperature superconducting wire is wound around the cylindrical reel. Such a configuration ensures a bending radius and protects the high-temperature superconducting wire. In addition, winding of the coated high-temperature superconducting wire is facilitated.

A twelfth aspect of the present disclosure is intended for the high-temperature superconducting coil of the tenth aspect of the present disclosure, in which the coated high-temperature superconducting wire is wound inside or outside a non-cylindrical reel, or is wound along a groove of the non-cylindrical reel.

The foregoing configuration brings about the effect of the flexible electrodeposited film made of polyimide even when the coated high-temperature superconducting wire is used with, e.g., a reel having an oval shape as viewed in the plane.

A thirteenth aspect of the present disclosure is intended for the high-temperature superconducting coil of the tenth aspect of the present disclosure, in which the coated high-temperature superconducting wire is wound inside or outside a reel defining an arc surface in at least part thereof, or is wound along a groove of the reel.

The foregoing configuration brings about the effect of the flexible electrodeposited film made of polyimide even when the coated high-temperature superconducting wire is used with the reel defining the arc surface in at least part thereof, such as reels having the following shapes: an oval shape, a race track shape (e.g., the shape of an athletics track filed), a saddle shape (e.g., the shape of a saddle for a horse) used for an accelerator, and a D-shape used for, e.g., a nuclear fusion reactor.

A fourteenth aspect of the present disclosure is intended for the high-temperature superconducting coil of any one of the ninth to thirteenth aspects of the present disclosure, in which part or all of the reel is removed.

The foregoing configuration brings about the effect of the flexible electrodeposited film made of polyimide even in the case where, after the coated high-temperature superconducting wire is wound around the reel, the reel is removed.

A fifteenth aspect of the present disclosure is intended for the high-temperature superconducting coil of any one of the ninth to fourteenth aspects of the present disclosure, in which the high-temperature superconducting coil is impregnated with an impregnation material, and the impregnation material is cured.

According to the foregoing configuration, since the flexible insulating layer made of polyimide by electrodeposition covers part or all of the outer periphery of the high-temperature superconducting wire including the corner parts thereof, it is ensured that transmission of force caused upon impregnation and curing of the impregnation material between the impregnation material and the high-temperature superconducting wire and transmission of force caused upon cooling or excitation of the coil between the impregnation material and the high-temperature superconducting wire are blocked. Thus, it is ensured that delamination of the high-temperature superconducting wire is reduced or prevented.

A sixteenth aspect of the present disclosure is intended for the high-temperature superconducting coil of the fifteenth aspect of the present disclosure, in which the impregnation material covers the insulating layer, and is completely separated from the high-temperature superconducting wire by the insulating layer.

According to the foregoing configuration, since the flexible insulating layer made of polyimide by electrodeposition is interposed between the impregnation material and the high-temperature superconducting wire, it is ensured that delamination of the high-temperature superconducting wire is reduced or prevented.

A seventeenth aspect of the present disclosure is intended for the high-temperature superconducting coil of any one of the ninth to sixteenth aspects of the present disclosure, in which a partially-cured resin-impregnated tape is interposed between adjacent ones of turns of the high-temperature superconducting wire of the high-temperature superconducting coil, and the coil is hardened.

According to the foregoing configuration, the coil is protected and insulated in a simple and efficient manner. This configuration also brings about the effect of the flexible electrodeposited film made of polyimide.

An eighteenth aspect of the present disclosure is intended for the high-temperature superconducting coil of any one of the ninth to sixteenth aspects of the present disclosure, in which a tape is, for insulation, thermal conduction, or detachment, attached to the high-temperature superconducting wire.

According to the foregoing configuration, insulation, thermal conduction, or detachment is allowed merely by winding the tape around the high-temperature superconducting wire. In this configuration, the coil is protected and insulated in a simple and efficient manner. This configuration also brings about the effect of the flexible electrodeposited film made of polyimide.

A nineteenth aspect of the present disclosure is intended for the high-temperature superconducting coil of any one of the ninth to sixteenth aspects of the present disclosure, in which a material is, for insulation, thermal conduction, or detachment, applied to the high-temperature superconducting wire.

Even in the case where the material for insulation, thermal conduction, or detachment is applied, the foregoing configuration brings about the effect of the flexible electrodeposited film made of polyimide.

A twentieth aspect of the present disclosure is intended for the high-temperature superconducting coil of any one of the ninth to sixteenth aspects of the present disclosure, in which a plurality of high-temperature superconducting wires are bonded together.

Even if the case where the high-temperature superconducting wires are bonded together, the foregoing configuration brings about the effect of the flexible electrodeposited film made of polyimide.

A twenty-first aspect of the present disclosure is intended for the high-temperature superconducting coil of any one of the ninth to sixteenth aspects of the present disclosure, in which the high-temperature superconducting wire is bonded to a reel or a tape material.

Even in the case where the high-temperature superconducting wire is bonded to the reel or the tape material, the foregoing configuration brings about the effect of the flexible electrodeposited film made of polyimide.

As described above, according to the present disclosure, since the insulating layer of the coated high-temperature superconducting wire is the electrodeposited film made of the block copolymerized polyimide which contains siloxane bonds in the polyimide main chain and which has the molecules with anionic groups, it is ensured that the insulating layer is formed. In addition, the low strength of the insulating layer due to siloxane allows the following with a simple configuration: delamination of the high-temperature superconducting wire used for the high-temperature superconducting coil can be reduced or prevented; and stable superconducting properties can be obtained. The electrodeposited film made of the block copolymerized polyimide which contains siloxane bonds in the polyimide main chain and which has the molecules with anionic groups can simultaneously provide, because of excellent mechanical properties and electrical insulating properties thereof, the following functions with a simple configuration in an efficient manner: a mechanical function and an electrical function to protect the coated high-temperature superconducting wire in which performance degradation or damage is likely to occur at a room temperature or a low temperature. For use as, e.g., a superconducting coil, a superconducting cable, a superconducting current lead, and a superconducting current limiter, it can be expected that performance degradation or damage of the coated superconducting wire is reduced or prevented, and stable superconducting properties are obtained.

BRIEF DESCRIPTION OF THE DRAWINGS

FIG. 16 is a table of experimental results of second to fourth examples and a second comparative example.

FIG. 17 is a table of experimental results of the fifth and sixth examples and a third comparative example.

FIG. 18 is a table of experimental results of seventh and eighth examples and a fourth comparative example.

DETAILED DESCRIPTION

An embodiment of the present disclosure will be described below with reference to drawings.

Figure 1:
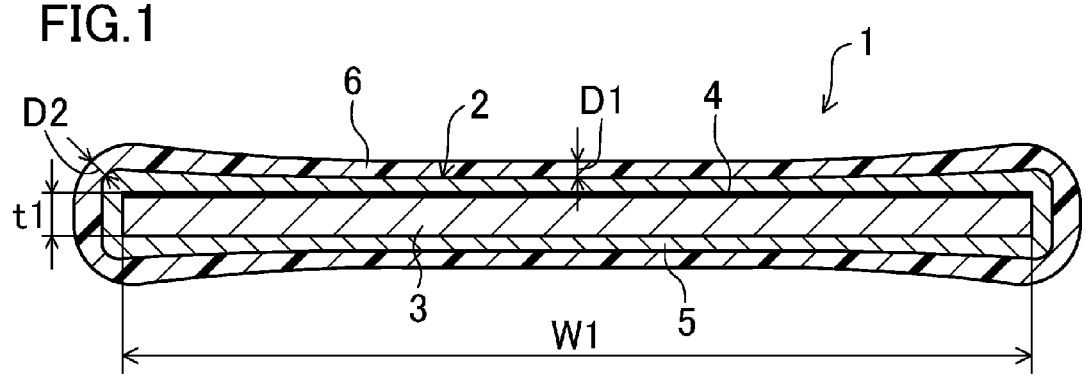
FIG. 1 is an enlarged cross-sectional view schematically illustrating a coated high-temperature superconducting wire of an embodiment of the present disclosure.

FIG. 1 illustrates a cross section of a coated high-temperature superconducting wire 1 of the embodiment of the present disclosure used for a superconducting coil. In the present embodiment, a superconducting yttrium-based wire 2 will be described as an example of a ReBCO wire which is a high-temperature superconducting wire. Note that, as in examples described later, a superconducting bismuth-based wire 2' may be used as the high-temperature superconducting wire (see FIG. 12).

The superconducting yttrium-based wire 2 is configured such that a yttrium-based superconductor 4 is stacked on a tape-shaped substrate 3 with an intermediate layer (not shown in the figure) being interposed therebetween. The intermediate layer has a function to inhibit growth of a superconducting film due to diffusion of elements of the substrate 3 in the yttrium-based superconductor 4 and to perform lattice matching between the yttrium-based superconductor 4 and the substrate 3. The substrate 3, the intermediate layer, and the yttrium-based superconductor 4 are covered by a stabilization layer 5. Since the superconducting yttrium-based wire 2 is a type of complex including a plurality of layers as described above, the superconducting yttrium-based wire 2 is susceptible to tensile stress in a thickness direction thereof and cleavage stress intensively acting on end parts of the superconducting yttrium-based wire 2 in a width direction thereof. Note that a cross-sectional shape illustrated in FIG. 1 has been set forth merely for the purpose of a preferred example in nature, and the present disclosure is not limited to such a cross-sectional shape. The cross-sectional shape may be, e.g., a shape described in a third example illustrated in FIG. 8.

The coated high-temperature superconducting wire 1 of the present disclosure is configured such that an electrodeposited film made of block copolymerized polyimide (hereinafter referred to as "siloxane bond-containing block copolymerized polyimide) which contains siloxane bonds in a polyimide main chain and which has molecules with anionic groups is provided as an insulating layer 6 on the outer periphery of the superconducting yttrium-based wire 2.

The "block copolymerized polyimide" means copolymerized polyimide obtained by the following steps: tetracarboxylic dianhydride and diamine are heated to generate imide oligomer (first reaction step); tetracarboxylic dianhydride identical with or different from the foregoing tetracarboxylic dianhydride and/or diamine identical with or different from the foregoing diamine are/is added to the imide oligomer to induce a reaction (second reaction step); and then random copolymerization due to an exchange reaction induced between amic-acid bonds is blocked to generate block copolymerized polyimide. The "electrodeposited film" is an insulating film obtained by heating (baking) a coating film obtained by electrodeposition of varnish (electrodeposition solution).

In the coated high-temperature superconducting wire 1 of the present disclosure, the insulating layer 6, i.e., the electrodeposited film made of the siloxane bond-containing block copolymerized polyimide, is adhered to the superconducting yttrium-based wire 2 with great adhesive force. When processing is performed to bent the coated high-temperature superconducting wire 1, the insulating layer 6 is not detached from the superconducting yttrium-based wire 2 or does not crack. Thus, the coated high-temperature superconducting wire 1 has excellent flexibility, processing resistance, and mechanical properties. In particular, the electrodeposited film made of polyimide satisfactorily coats the outer periphery of the superconducting yttrium-based wire 2 without causing pinholes. For the superconducting yttrium-based wire 2 having a rectangular cross section, the electrodeposited polyimide film satisfactorily coats not only flat parts but also corner parts of the superconducting yttrium-based wire 2. Thus, the coated high-temperature superconducting wire 1 having the rectangular cross section can be configured to have excellent heat resistance, flexibility, processing resistance, mechanical properties, and voltage resistance. According to the present disclosure, in the block copolymerized polyimide which contains the siloxane bonds in the polyimide main chain and which has the molecules with the anionic groups, the siloxane bonds in the main chain may be siloxane bonds of the tetracarboxylic dianhydride or siloxane bonds of the diamine. However, the siloxane bonds are preferably the siloxane bonds of the diamine. Typically, block copolymerized polyimide obtained by using, as at least part of diamine component, a diamine compound (hereinafter referred to as a "siloxane bond-containing diamine compound") having siloxane bonds (—Si—O—) in a molecular frame is used.

In the present disclosure, any types of siloxane bond-containing diamine compound may be used without limitation as long as the siloxane bond-containing diamine compound can be imidized with the tetracarboxylic dianhydride. Examples of the siloxane bond-containing diamine compound include bis(4-aminophenoxy)dimethylsilane, 1,3-bis(4-aminophenoxy)-1,1,3,3-tetramethyldisiloxane, and a compound represented by the following general formula (I):

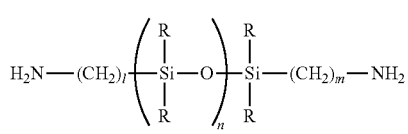

(I)

(where "R" independently represents an alkyl group, a cycloalkyl group, a phenyl group, or a phenyl group substituted with one to three alkyl groups or alkoxyl groups, "l" and "m" each represent an integer of 1-4, and "n" represents an integer of 1-20). Examples of the compound represented by the general formula (I) include a single compound represented by the general formula (I) where "n" is 1 or 2, and polysiloxanediamine.

For "R" in the general formula (I), the carbon number of the alkyl group or the cycloalkyl group is preferably 1-6, and more preferably 1-2. For the phenyl group substituted with one to three alkyl groups or alkoxyl groups, if the phenyl group is substituted with two or three alkyl groups or alkoxyl groups, the alkyl groups or the alkoxyl groups may be identical with or different from each other. The carbon number of the alkyl group or the alkoxyl group is preferably 1-6, and more preferably 1-2.

For the compound represented by the general formula (I), "R" in the general formula (I) is preferably the alkyl group (particularly a methyl group) or the phenyl group. In addition, the compound represented by the general formula (I) is preferably polysiloxanediamine represented by the general formula (I) where "l" and "m" each are 2-3 and "n" is 5-15.

Preferable Example of polysiloxanediamine include bis(γ-aminopropyl)polydimethylsiloxane (in the general formula (I), "l" and "m" each are 3, and "R1" and "R2" each are the methyl group), and bis(γ-aminopropyl)polydiphenylsiloxane (in the general formula (I), "l" and "m" each are 3, and "R1" and "R2" each are the phenyl group).

In the present disclosure, a single type of siloxane bond-containing diamine compound may be used, or two or more types of siloxane bond-containing diamine compound may be used in combination. Preferably, the siloxane bond-containing diamine compound is one selected from a group consisting of bis(4-aminophenoxy)dimethylsilane, 1,3-bis(4-aminophenoxy)-1,1,3,3-tetramethyldisiloxane, and the compound represented by the general formula (I).

Note that a commercially-available siloxane bond-containing diamine compound may be used. Products manufactured by Shin-Etsu Chemical Co., Ltd., Dow Corning Corporation, and Chisso Corporation can be used as they are. Specifically, e.g., KF-8010 (bis(γ-aminopropyl)polydimethylsiloxane containing an amino group equivalent of about 450) and X-22-161A (bis(γ-aminopropyl)polydimethylsiloxane containing an amino group equivalent of about 840) manufactured by Shin-Etsu Chemical Co., Ltd. can be used.

In the present disclosure, the siloxane bond-containing block copolymerized polyimide is obtained by the following steps: the substantially same amount of, e.g., a diamine compound containing at least the siloxane bond-containing diamine compound and tetracarboxylic dianhydride is prepared, and the diamine compound and the tetracarboxylic dianhydride are heated and polycondensed in an organic polar solvent under the presence of a catalyst made of lactone and base. That is, at a first step, tetracarboxylic dianhydride and a diamine compound are heated to generate an imide oligomer. Then, at a second step, a diamine compound and/or tetracarboxylic dianhydride are/is further added to the imide oligomer to induce a reaction, resulting in the block copolymerization of the diamine compound and the tetracarboxylic dianhydride. At this point, as the diamine compound used at the first step and/or the second step, the siloxane bond-containing diamine compound is implanted as part of a block segment. In the reaction, acid anhydride such as phthalic anhydride and/or an amine compound such as aniline may be added to a reaction system as an end capping agent. Examples of the organic polar solvent include N,N-dimethylformamide (DMF), N,N-dimethylacetamide (DMAc), dimethylsulfoxide (DMSO), N-methyl-2-pyrrolidone (NMP), γ-butyrolactone (γBL), anisole, cyclohexanone, tetramethylurea, and sulfolane. Considering compatibility with polyimide, NMP is preferable as the organic polar solvent.

In the present disclosure, the usage amount of the siloxane bond-containing diamine compound is preferably an amount at which imide units containing the diamine component are about 5-90 mol % of the total repeating units (imide units) forming polyimide, more preferably about 10-70 mol %, and even more preferably about 15-50 mol %. If the amount of imide units containing the siloxane bond-containing diamine compound is less than about 10 mol %, an electrodeposited film made of such polyimide is less preferable because significant reduction in adhesion of the electrodeposited film to the superconducting yttrium-based wire 2 and significant reduction in degree of extensibility of the electrodeposited film result in insufficient flexibility. This leads to occurrence of detachment and cracking. On the other hand, if the amount of imide units containing the siloxane bond-containing diamine compound exceeds about 90 mol %, an electrodeposited film made of such polyimide is less preferable because heat resistance is reduced.

The coated high-temperature superconducting wire 1 is fabricated by electrodepositing and baking siloxane bond-containing block copolymerized polyimide varnish (i.e., varnish (electrodeposition solution) containing the siloxane bond-containing block copolymerized polyimide as a resin content) on the outer periphery of the superconducting yttrium-based wire 2.

That is, the electrodeposited film is formed as follows. Siloxane bond-containing block copolymerized polyimide having anion groups (e.g., carboxylic groups and sulfonic groups) is dissolved in an organic polar solvent, thereby forming a solution. Water, a poor solvent for polyimide, and a neutralizer (basic compound) for changing polyimide into neutralized salt are further added to the solution to prepare solution-dispersion type varnish. The solution-dispersion type varnish is electrodeposited and baked on an adherend, thereby forming an electrodeposited film. According to such a method, there is no disadvantage caused as in a conventional method. Even for the superconducting yttrium-based wire 2 having the rectangular cross section, the electrodeposited film can be formed so as to satisfactorily coat not only the flat parts but also the corner parts of the superconducting yttrium-based wire 2 without causing pinholes. Since part or all of the outer periphery of the superconducting yttrium-based wire 2 including the corner parts thereof can be substantially uniformly covered, the corner parts where electrical discharge is likely to occur can be protected. Such a feature brings about an excellent effect for, e.g., a superconducting cable, a superconducting current lead, and a superconducting current limiter used for superconducting power transmission.

In the present disclosure, since the siloxane bond-containing block copolymerized polyimide is for an insulating coating film (insulating layer 6) of an electrical wire, the siloxane bond-containing block copolymerized polyimide is required to have sufficient heat resistance. Typically, in addition to the siloxane bond-containing diamine compound, aromatic diamine is used as the diamine component. Examples of the aromatic diamine include m-phenylenediamine; p-phenylenediamine; 2,4-diaminotoluene; 4,4'-diamino-3,3'-dimethyl-1,1'-biphenyl; 4,4'-diamino-3,3'-dihydroxy-1,1'-biphenyl; 3,3'-diaminodiphenylether; 3,4'-diaminodiphenylether; 4,4'-diaminodiphenylether; 4,4'-diaminodiphenylsulfide; 2,2-bis(4-aminophenyl)propane; 2,2-bis(4-aminophenyl) hexafluoropropane; 1,3-bis(4-aminophenoxy)benzene; 1,4-bis(4-aminophenoxy)benzene; 4,4'-bis(4-aminophenoxy)biphenyl; 2,2'-bis[4-(4-aminophenoxy)phenyl]propane; 2,2'-bis[4-(4-aminophenoxy)phenyl]hexafluoropropane; bis[4-(3-aminophenoxy)phenyl]sulfone, bis[4-(4-aminophenoxy)phenyl]sulfone; 3,5-diaminobenzoic acid; 3,3'-dicarboxy-4,4'-diaminophenylmethane; 2,4-diaminophenylacetic acid; 2,5-diaminoterephthalic acid; 3,5-diamino-p-toluic acid; 3,5-diamino-2-naphthalenecarboxylic acid; 1,4-diamino-2-naphthalenecarboxylic acid; 2,6-diaminopyridine; 2,6-diamino-4-methylpyridine; 4,4'-(9-fluorenylidene)dianiline; 4,4'-diaminodiphenylsulfone; and α,α-bis(4-aminophenyl)-1,3-diisopropylbenzene. Any one of the foregoing compounds may be used alone, or any two or more of the foregoing compounds may be used in combination. Since the foregoing compounds have excellent low-temperature resistance, no adverse effect such as detachment, curing, and cracking of the insulating layer 6 is provided on the insulating layer 6 even if the foregoing compounds are used at a low temperature of about 0-90 K at which the superconducting yttrium-based wire 2 is typically used. As described above, in the present disclosure, in order to change the siloxane bond-containing block copolymerized polyimide into the neutralized salt in the varnish, it is required that the siloxane bond-containing block copolymerized polyimide is polyimide having anion groups such as carboxylic groups and sulfonic groups. Thus, for at least part of a diamine compound other than the siloxane bond-containing diamine compound, a compound having anion groups such as carboxylic groups and sulfonic groups is used. Of the foregoing examples of the aromatic diamine, at least carboxylic group-containing aromatic diamine (aromatic diamine carboxylic acid) and/or sulfonic group-containing aromatic diamine (aromatic diamine sulfonic acid) are/is used. Of the foregoing compounds, examples of the carboxylic group-containing aromatic diamine (aromatic diamine carboxylic acid) include 3,5-diaminobenzoic acid; 3,3'-dicarboxy-4,4'-diaminophenylmethane; 2,4-diaminophenylacetic acid; 2,5-diaminoterephthalic acid; 3,5-diamino-p-toluic acid; 3,5-diamino-2-naphthalenecarboxylic acid; 1,4-diamino-2-naphthalenecarboxylic acid. Examples of the sulfonic group-containing aromatic diamine (aromatic diamine sulfonic acid) include 2,5-diaminobenzenesulfonic acid; 4,4'-diamino-2,2'-stilbenedisulfone; and o-tolidinedisulfonic acid.

In the present disclosure, the content of the carboxylic group-containing aromatic diamine (aromatic diamine carboxylic acid) and/or the sulfonic group-containing aromatic diamine (aromatic diamine sulfonic acid) in the siloxane bond-containing block copolymerized polyimide is equal to or greater than about 10 mol % of the total diamine content, and preferably equal to or greater than about 15 mol %.

In the present disclosure, aromatic tetracarboxylic dianhydride is typically used as the tetracarboxylic dianhydride contained in the siloxane bond-containing block copolymerized polyimide, considering, e.g., heat resistance, long-term stability, and electrodepositability of polyimide and adhesion of polyimide to metal. Specific examples of the aromatic tetracarboxylic dianhydride include pyromellitic dianhydride; 3,3',4,4'-biphenyltetracarboxylic dianhydride; bis-(3,4-dicarboxyphenyl)ether dianhydride; 3,3',4,4'-benzophenonetetracarboxylic dianhydride; 2,2-bis-(3,4-dicarboxyphenyl) hexafluoropropane dianhydride; 3,3',4,4'-biphenylsulfonetetracarboxylic dianhydride; and bicyclo[2,2,2]octo-7-ene-2,3,5,6-tetracarboxylic dianhydride. Any one of the foregoing compounds may be used alone, or any two or more of the foregoing compounds may be used in combination. Of the foregoing compounds, 3,3',4,4'-biphenyltetracarboxylic dianhydride, bis-(3,4-dicarboxyphenyl) ether dianhydride, 3,3',4,4'-benzophenonetetracarboxylic dianhydride, or 3,3',4,4'-biphenylsulfonetetracarboxylic dianhydride is preferably used considering, e.g., heat resistance, adhesion to the superconducting yttrium-based wire 2, compatibility with the siloxane bond-containing diamine compound, and polymerization rate of polyimide.

In the present disclosure, the siloxane bond-containing block copolymerized polyimide preferably has an intrinsic (logarithmic) viscosity (about 25° C.) of about 5,000-50,000 mPa·s in a N-methyl-2-pyrrolidone (NMP) solution of about 20 wt %, and more preferably about 5,000-15,000 mPa·s. If the intrinsic viscosity exceeds about 50,000 mPa·s, uniformity of the electrodeposited film to be formed tends to be reduced.

The weight-average molecular weight (Mw) of the siloxane bond-containing block copolymerized polyimide is preferably about 20,000-150,000 in polystyrene equivalent weight units, and more preferably about 45,000-90,000. If the weight-average molecular weight is less than about 20,000, the following tendency may be exhibited: a product value is reduced due to degradation of heat resistance of the electrodeposited film and worsening of an appearance of the coated high-temperature superconducting wire 1 caused by roughening of a film surface. On the other hand, if the weight-average molecular weight exceeds about 150,000, an increase in viscosity of the siloxane bond-containing block copolymerized polyimide or gelatinization of the siloxane bond-containing block copolymerized polyimide is accelerated in the solution, and therefore there is a possibility to interfere electrodeposition. The number-average molecular weight (Mn) of the siloxane bond-containing block copolymerized polyimide is preferably about 1,000-70,000 in polystyrene equivalent weight units, and more preferably about 20,000-40,000. If the number-average molecular weight is less than about 1,000, the following tendency may be exhibited: productivity of the coated high-temperature superconducting wire 1 is reduced due to reduction in electrodeposition efficiency and high consumption of time to form an electrodeposited film having a desired thickness. In addition, there is a possibility that requirements for heat resistance and voltage resistance of the coated high-temperature superconducting wire 1 cannot be satisfied. If the number-average molecular weight exceeds about 70,000, the following tendency may be exhibited: workability is reduced due to an increase in intrinsic viscosity and degradation of antifoaming performance (i.e., the state in which air bubbles taken into the electrodeposited film cannot be removed).

The "weight-average molecular weight" and the "number-average molecular weight" are polystyrene equivalent molecular weights obtained by GPC, i.e., values measured by using, as a GPC device, HLC-8220 manufactured by Tosho Corporation and using, as a column, TSK-gel Super HM-M (Column No. -D0038) manufactured by Tosho Corporation.

In the present disclosure, the varnish (electrodeposition solution) containing the siloxane bond-containing block copolymerized polyimide is specifically prepared as follows. First, under the presence of an acid catalyst, a diamine compound and tetracarboxylic dianhydride are heated at about 160-180° C. in at least one organic polar solvent selected from a group consisting of, e.g., NMP, DMF, DMAc, γ-butyrolactone, DMSO, anisole, cyclohexanone, tetramethylurea, and sulfolane. Meanwhile, water generated by the reaction between the diamine compound and the tetracarboxylic dianhydride is evaporated by azeotropy. As a result, oligomer is generated (first reaction step). Then, a diamine compound and/or tetracarboxylic dianhydride are/is further added to the oligomer, and then a second reaction step (heating) is performed by heating the resultant at about 160-180° C. At this point, a siloxane bond-containing diamine compound is used as the diamine compound used at the first reaction step and/or the second reaction step, thereby obtaining block copolymerized polyimide containing siloxane bonds in a main chain. The solid concentration of the reaction solution obtained in the foregoing manner is preferably about 10-40 mass %, and more preferably about 20-30 mass %. Next, the block copolymerized polyimide dissolved in the polar solvent is neutralized by a base compound, and then water and a poor solvent for polyimide are added to the resultant to form an electrodeposition solution. As the base compound, e.g., N,N-dimethylethanolamine, triethylamine, triethanolamine, N-dimethylbenzylamine, or N-methylmorpholine is used. The usage amount of the base compound is set to such an amount that the polyimide can be stably dissolved or dispersed in the water solution, and is typically about 30-200 mol % of a theoretical neutralization amount. As the poor solvent, alcohol having phenyl groups, furfuryl groups, or naphthyl groups is preferable. Specifically, examples of the poor solvent include benzyl alcohol, 2-phenylethyl alcohol, 4-methylbenzyl alcohol, 4-methoxybenzyl alcohol, 4-chlorbenzyl alcohol, 4-nitrobenzyl alcohol, phenoxy-2-ethanol, cinnamyl alcohol, furfuryl alcohol, and naphthyl carbinol. The amount of the polar solvent in the varnish (electrodeposition solution) is preferably about 1.5-10 parts by weight per part of the polyimide, and more about preferably 2.4-6 parts by weight. The amount of the water in the varnish is preferably about 0.1-5 parts by weight per part of the polyimide, and more preferably about 1-3 parts by weight.

In the present disclosure, electrodeposition conditions when an electrodeposited film made of the polyimide varnish is formed on the outer periphery of the superconducting yttrium-based wire 2 by a constant current method or a constant voltage method are as follows. For example, in the case of the constant current method, a current value is fixed at about 20 mA, and the upper limit of DC voltage is about 1-200 V and more preferably about 5-20 V. If the upper limit of electrodeposition voltage is lower than about 1V, it is difficult to form a coating film by electrodeposition. On the other hand, if the upper limit of electrodeposition voltage is higher than about 200 V, a coating film is formed to an extremely large thickness. In the case of the constant voltage method, a voltage value may be fixed at about 1-200 V, and preferably about 5-20 V. If the voltage value is fixed at a value lower than about 1 V, it is difficult to form a coating film by electrodeposition. On the other hand, if the voltage value is fixed at a value higher than about 200 V, a coating film is formed to an extremely large thickness. In either the constant current method or the constant voltage method, an electrodeposition time is typically about 5-120 seconds, and preferably about 10-60 seconds. In addition, the temperature of the varnish (electrodeposition solution) upon electrodeposition is preferably about 10-70° C., and more preferably about 15-25° C.

For baking of a coating film formed by electrodeposition, it is preferable that, after a first baking step is performed at about 70-110° C. for about 0.5-10 minutes, a second baking step is performed at about 160-180° C. for about 0.5-10 minutes, and then a third baking step is performed at a temperature lower than about 250° C. for about 0.5-10 minutes. By performing the baking at the three steps, a sufficiently-cured polyimide coating film adhered to the superconducting yttrium-based wire 2 with great adhesive force can be formed. Since performance of the superconducting yttrium-based wire 2 is degraded under a high temperature of equal to or higher than about 250° C., it is preferable that baking is not performed at a temperature equal to or higher than about 250° C. Since an electrodeposition material of the present disclosure is a material which is cured not by baking but by drying, baking at a temperature lower than about 250° C. is allowed.

Figure 2:
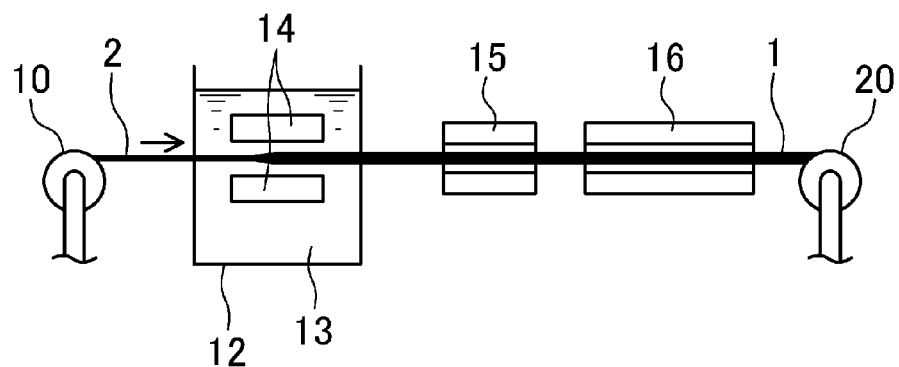
FIG. 2 is a front view schematically illustrating an electrodeposition/baking device for the coated high-temperature superconducting wire.

In the present disclosure, the varnish is preferably electrodeposited and baked by, e.g., a device illustrated in FIG. 2. That is, in the state in which a superconducting yttrium-based wire 2 wound around a first roll 10 is, at one end thereof, pulled out and is connected to a positive terminal of a DC power supply, the superconducting yttrium-based wire 2 passes through an electrodeposition bath 12 filled with varnish (electrodepostion solution) 13. Cathode tubes 14 are arranged in the electrodeposition bath 12. When the superconducting yttrium-based wire 2 passes through the electrodeposition bath 12, voltage is applied as described above, and polyimide is substantially uniformly deposited on the superconducting yttrium-based wire 2 due to a potential difference between the superconducting yttrium-based wire 2 at the anode and the cathode tube 14 at the cathode. After the superconducting yttrium-based wire 2 passed through the electrodeposition bath 12, the electrodeposition bath 12 enters a drying device 15. In the drying device 15, water contained in the polyimide deposited on the superconducting yttrium-based wire 2 is evaporated. After the electrodeposition bath 12 passed through the drying device 15, the electrodeposition bath 12 enters a baking furnace 16, and a coating film (insulating layer 6) made of the polyimide is formed. Then, the insulated conducting wire is wound by a second roll 20. By electrodepositing and baking the varnish by the foregoing device, the intended coated high-temperature superconducting wire 1 can be successively formed. By dip coating, it is difficult to substantially uniformly coat a long wire. On the other hand, a long wire can be substantially uniformly coated by electrodeposition, and electrodeposition is applicable to, e.g., a wire having a length of about 10 km. Thus, it is expected that electrodeposition is employed for, e.g., a large superconducting magnet and a long superconducting power transmission cable.

The coated high-temperature superconducting wire 1 of the present disclosure is configured such that the insulating layer 6 covering the outer periphery of the superconducting yttrium-based wire 2 is the electrodeposited film made of the polyimide having the siloxane bonds in the polyimide main chain. Thus, in the coated high-temperature superconducting wire 1, the insulating layer 6 uniformly coats the outer periphery of the superconducting yttrium-based wire 2 without causing pinholes, and the insulating layer 6 having sufficient flexibility is adhered to the superconducting yttrium-based wire 2 with great adhesive force. In particular, the coated high-temperature superconducting wire 1 can be fabricated, in which the insulating layer 6 made of the polyimide uniformly coats, with great adhesive force, the outer periphery of the superconducting yttrium-based wire 2 having the rectangular cross section, and satisfactorily coats not only the flat parts but also the corner parts of the superconducting yttrium-based wire 2. Thus, the coated high-temperature superconducting wire 1 of the present disclosure is configured to have good heat resistance, low-temperature resistance, and voltage resistance and to have excellent flexibility, processing resistance, and mechanical properties which reduce occurrence of detachment or cracking of the insulating layer 6 (electrodeposited film) when processing is performed to bent the coated high-temperature superconducting wire 1. Such a feature brings about an excellent effect for, e.g., a superconducting cable, a superconducting current lead, and a superconducting current limiter used for purposes (e.g., superconducting power transmission) requiring flexibility, processing resistance, and mechanical properties of the insulating layer at a room temperature or a low temperature.

Referring to the cross section (cross section in a direction perpendicular to a longitudinal direction of the coated high-temperature superconducting wire 1) of the coated high-temperature superconducting wire 1 illustrated in FIG. 1, the thickness ("t1" in FIG. 1) of the rectangular superconducting yttrium-based wire 2 in the coated high-temperature superconducting wire 1 of the present disclosure is, e.g., about 0.05-1.5 mm, and the width ("W1" in FIG. 1) of the superconducting yttrium-based wire 2 is, e.g., about 2-40 mm. In the present embodiment, the coated high-temperature superconducting wire 1 is an extremely-thin tape-shaped wire having an aspect ratio of at least about 10 or more. For the sake of easy understanding of a drawing in FIG. 1, the thickness of the coated high-temperature superconducting wire 1 is increased, but an actual thickness of the coated high-temperature superconducting wire 1 is, as viewed in the cross section, much smaller than that of the coated high-temperature superconducting wire 1 illustrated in FIG. 1. The thickness of the insulating layer 6 which is the electrodeposited film made of the polyimide varnish is, in the flat part of the superconducting yttrium-based wire 2, preferably about 1.5-30 $\mu$m, and more preferably about 5-20 $\mu$m. If such a thickness is less than about 1.5 $\mu$m, it is difficult to obtain a sufficient alternating current (AC) withstand voltage flow. Even if the thickness exceeds about 30 $\mu$m, no noticeable improvement in an AC withstand voltage flow is observed, and the size of the coated high-temperature superconducting wire 1 is increased. When a high-temperature superconducting coil is fabricated, it is important to consider magnetic field generation efficiency, i.e., efficiency for generating a magnetic field having a high current density corresponding to the cross-sectional area of the high-temperature superconducting coil including an electrical insulating layer. Thus, it is an advantage of the electrodeposited film that the thickness of the electrical insulating layer can be freely selected (e.g., a smaller thickness is selected). Conversely, for electrical insulation of a superconducting cable, the thickness of an insulating layer is increased in order to obtain high electrical insulation performance. Since the thickness of the electrical insulating layer can be freely selected (e.g., a larger thickness is selected), the electrodeposited film is suitably applicable to the superconducting cable. On the other hand, in order to reduce or prevent a drop in AC withstand voltage in the corner parts (where electrical field concentration is likely to occur and influences voltage resistance) of the superconducting yttrium-based wire 2, the thickness of the insulating layer 6 is, in the corner part, preferably at least a thickness about 0.8 times larger than that of the insulating layer 6 in the flat part, and more preferably a thickness about 0.9 times larger than that of the insulating layer 6 in the flat part. Considering voltage resistance and reduction in size and weight of the coated high-temperature superconducting wire 1 (coil using the coated high-temperature superconducting wire 1), the specific thickness of the insulating layer 6 in the corner part is a thickness about 0.8-4 times larger than that of the insulating layer 6 in the flat part, preferably a thickness about 0.9-3 times larger than that of the insulating layer 6 in the flat part, and more preferably a thickness about 1.0-2.5 times larger than that of the insulating layer 6 in the flat part. If the thickness of the insulating layer 6 in the corner part of the superconducting yttrium-based wire 2 falls below a thickness about 0.8 times larger than that of the insulating layer 6 in the flat part, AC withstand voltage in the corner part is significantly dropped due to electrical field concentration. On the other hand, if the thickness of the insulating layer 6 in the corner part of the superconducting yttrium-based wire 2 exceeds a thickness about 4 times larger than that of the insulating layer 6 in the flat part, it is difficult to reduce the size and weight of the coated high-temperature superconducting wire 1. In the present disclosure, the thickness of the insulating layer 6 covering the outer peripheral of the rectangular superconducting yttrium-based wire 2 is, referring to FIG. 1, the thickness ("D1" in FIG. 1) of the insulating layer 6 at a middle point of a long side of the rectangular superconducting yttrium-based wire 2 as viewed in the cross section. The thickness of the insulating layer 6 in the corner part of the rectangular superconducting yttrium-based wire 2 is the thickness ("D2" in FIG. 1) of the insulating layer 6 covering a corner formed between the long side and a short side of the rectangular superconducting yttrium-based wire 2 as viewed in the cross section.

Figure 3:
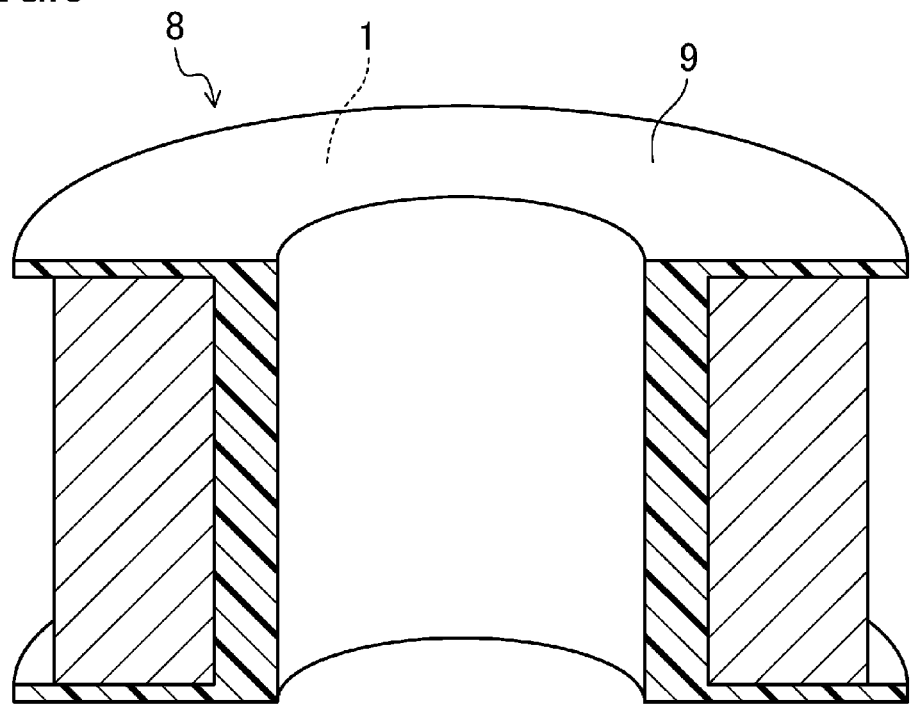
FIG. 3 is a perspective cross-sectional view schematically illustrating an appearance of a high-temperature superconducting coil.

Referring to FIG. 3, a high-temperature superconducting coil 8 of the present disclosure is formed, e.g., by winding the coated high-temperature superconducting wire 1 of the present disclosure around a cylindrical reel 9.

The following materials are used as a material of the reel 9: polymers such as epoxy resin, fiber reinforced resin (e.g., FRP), and bakelite; and metal materials such as stainless steel, copper, aluminum, and titanium. After the winding of the coated high-temperature superconducting wire 1, the coil is impregnated with epoxy resin, and the epoxy resin is cured. An impregnation material is not limited to epoxy resin, but may be, e.g., paraffin, paraffin wax, grease, varnish, and phenol resin. A superconducting yttrium-based wire is formed in such a manner that a rare-earth-based superconductor is formed on a tape-shaped substrate made of a nickel alloy with an intermediate layer being interposed therebetween and then is covered by silver, and copper plating or a copper plate is bonded to the resultant. The superconducting yttrium-based wire is extremely susceptible to tensile stress in a thickness direction thereof and cleavage stress on end parts of the wire in a width direction thereof. Due to "cleavage stress" caused as a result of concentrating, e.g., stress caused upon impregnation and curing of a hard impregnation material (e.g., epoxy resin), thermal stress, and electromagnetic stress on the end parts of the wire in the width direction thereof, the superconducting yttrium-based wire inside the coil is mechanically damaged. This causes delamination resulting in property degradation. In the present embodiment, part or all of the outer periphery of the superconducting yttrium-based wire 2 including the corner parts thereof is covered by the insulating layer 6. Thus, a flexible low-strength insulating layer containing siloxane can block force transmission between an impregnation material and a ReBCO wire. Consequently, it is ensured that delamination of the ReBCO wire is reduced or prevented, resulting in reduction or prevention of degradation of coil properties.

As a winding method, e.g., the following methods can be used: a solenoid widing method in which a superconducting wire is regularly lap-wound such as winding of thread on a reel; a pancake winding method in which unit coils each formed by winding a rectangular wire are concentrically stacked on each other; and a double-pancake winding method in which unit coils each including two coils are stacked on each other. The shape of the reel is not limited to a cylindrical shape, and examples of the shape of the reel include any non-cylindrical reel shapes such as an oval shape, a race track shape (e.g., the shape of an athletics track filed), a saddle shape (e.g., the shape of a saddle for a horse) used for an accelerator, and a D-shape used for, e.g., a nuclear fusion reactor. The reel may be in such a shape that a flange is formed at each end of the reel. Examples of the coil of the present disclosure also include a coil formed by winding a superconducting wire along a reel positioned on an outer side while pressing the superconducting wire against the reel. The reel is not necessarily provided in the present disclosure. The coil having any of the foregoing shapes may have no reel or have only part of the reel. Alternatively, the coil may be formed not by winding the superconducting wire around the reel, but by fitting a superconducting wire in a recessed groove of a base plate.

As impregnation, e.g., the following impregnations are employed: coating type impregnation in which a superconducting wire is wound while epoxy resin is applied and the epoxy resin is cured at the end; and vacuum impregnation or vacuum pressure impregnation in which, after a superconducting wire is wound into a coil, the entirety of the coil is vacuum-impregnated or vacuum-pressure-impregnated. Alternatively, a method may be employed, in which "simultaneous winding" of a prepreg tape made of, e.g., epoxy resin and a superconducting wire is performed and the prepreg tape and the superconducting wire are hardened together by, e.g., heating at the end. The impregnation material is not limited to epoxy resin, and may be, e.g., other types of curable resin such as phenol resin, paraffin, paraffin wax, wax, grease, and varnish.

The coated superconducting wire may be further covered by, e.g., another type of insulating tape. The coated superconducting wire may be configured to have epoxy detaching properties improved by applying an epoxy detaching agent or an agent (e.g., grease) having epoxy detaching properties to a surface of the coated superconducting wire or by attaching a tape (e.g., a Teflon (registered trademark) tape) having epoxy detaching properties to the surface of the coated superconducting wire. The impregnation material such as epoxy resin may contain a filler added for the purpose of adjusting, e.g., a heat shrinkage amount. Glass fibers or an insulating sheet made of, e.g., polymer may be interposed between adjacent ones of turns of the coil. As measures against electromagnetic force, a glass sheet or a metal wire may be wound around the outer periphery of the coil.

The size of the coated high-temperature superconducting wire 1 used for the high-temperature superconducting coil 8 of the present disclosure is not limited. Depending on the intended use of the high-temperature superconducting coil 8, the size of the coated high-temperature superconducting wires 1 varies. Since the high-temperature superconducting coil 8 of the present disclosure is formed from the coated high-temperature superconducting wire 1 including the electrodeposited film having flexibility as the insulating layer 6, the insulating layer 6 is not detached or cracked even upon processing for forming the high-temperature superconducting coil 8 (particularly upon edgewise winding).

The high-temperature superconducting coil 8 of the present disclosure is configured such that the coated high-temperature superconducting wire 1 wound to form the high-temperature superconducting coil 8 has excellent heat resistance and voltage resistance, and the insulating coating film (insulating layer 6) is, even if processing is performed to bent the coated high-temperature superconducting wire 1, less likely to be detached from the superconducting yttrium-based wire 2. Thus, the high-temperature superconducting coil 8 is configured not only to have good heat resistance, low-temperature resistance, and voltage resistance but also to have significantly-improved durability. For example, it is expected that burnout can be reduced or prevented even when an energized superconducting coil quenches and the temperature of the high-temperature superconducting coil increases. As the cylindrical coil, specific uses of the high-temperature superconducting coil 8 of the present disclosure include, e.g., a coil for NMR or MRI, a high magnetic field coil used for material evaluation, a detector coil for an accelerator, a superconducting magnetic energy storage (SMES) coil, and a central solenoid coil or a poloidal coil for nuclear fusion. As the non-cylindrical coil, specific uses of the high-temperature superconducting coil 8 of the present disclosure include, e.g., a race track-shaped coil used for, e.g., a linear motor car or a motor, a saddle-shaped coil used for an accelerator or a power generator, and a D-shaped toroidal coil for a nuclear fusion reactor. The winding pitch, shape, etc. of the high-temperature superconducting coil 8 vary depending on products to which the high-temperature superconducting coil 8 is employed. Since the present disclosure is versatile and is applicable to the coil having any of the foregoing shapes, the winding pitch, shape, etc. of the high-temperature superconducting coil 8 are arbitrarily determined.

Even for a 90 K-class superconducting coil, a method for cooling a coil is not limited to cooling using liquid nitrogen. Examples of the cooling method include cooling by using, e.g., liquid hydrogen, liquid helium, or superfluid helium. In addition, the examples of the cooling method include conduction cooling for cooling a superconducting coil by using a small refrigerator. The operation temperature of the coil falls within a range between about 1 K and about 90 K.

In order to reduce or prevent mechanical degradation due to delamination of the superconducting yttrium-based wire 2 of the coil caused by impregnation of epoxy resin 7, the coated high-temperature superconducting wire 1 of the present embodiment is configured such that the epoxy resin 7 and the superconducting yttrium-based wire 2 do not directly contact each other, and tension from the epoxy resin 7 does not transmitted. Since the insulating layer 6 has flexibility even at a low temperature and low compatibility with epoxy resin, the insulating layer 6 functions as a cushion against tensile stress at the middle of the superconducting yttrium-based wire 2 in the thickness direction thereof and cleavage stress at the end parts of the superconducting yttrium-based wire 2 in the longitudinal direction thereof. Thus, the foregoing configuration is realized.

The insulating layer 6 brings about the state in which bonding strength of the insulating layer 6 to epoxy resin is relatively low due to an effect of silicon mainly contained in the insulating layer 6. The insulating layer 6 also brings about the state in which the coating film becomes flexible with a relatively-low strength due to both of the effect of silicon and a relatively-low cross-linking ratio of polymer chains. As a result, the insulating layer 6 functions as a cushion for blocking force transmission between epoxy resin and the superconducting yttrium-based wire 2. Thus, delamination of the superconducting yttrium-based wire 2 of the high-temperature superconducting coil 8 can be reduced or prevented with a simple configuration, thereby obtaining stable superconducting properties.

Experiment for Evaluating Coil Performance

Next, the following experiment was performed in order to confirm an effect of an insulating layer 6 after impregnation of epoxy resin 7 in a high-temperature superconducting coil 8 (see FIG. 3) formed by winding a superconducting yttrium-based wire 2 of the foregoing embodiment.

FIRST EXAMPLE AND FIRST COMPARATIVE EXAMPLE (Experimental Procedure)

In a first example, a superconducting yttrium-based wire 2 (SCS4050 manufactured by Super Power Inc.) including copper plating, i.e., a stabilization layer 5, was coated by the method of the foregoing embodiment illustrated in FIG. 2. The coated high-temperature superconducting wire 1 was used to form a non-impregnated double pancake coil (a coil inner diameter of about 30 mm, a coil outer diameter of about 37.5 mm, and a coil height of about 9.4 mm). As a reel 9, a cylinder made of fiber reinforced plastic and having a thickness of about 3 mm was used. Such a coil was, as a first comparative example, energized in liquid nitrogen, and voltage-current (V-I) characteristics were measured. Note that it has been reported in advance that coil properties are not degraded in the case of the non-impregnated coil. Subsequently, another coil 8 was impregnated with epoxy resin 7 (Stycast 1266 (registered trademark) manufactured by Emerson and Cuming), and the epoxy resin 7 was cured. In such a manner, a high-temperature superconducting coil 8 was formed as the first example. Then, the high-temperature superconducting coil 8 was energized in liquid nitrogen.

(Experimental Results)

In the first example, the superconducting yttrium-based wire 2 illustrated in FIG. 1 is sufficiently coated even in corner parts thereof where electrical field concentration occurs. However, in a conventional method in which dipping and baking are repeated, it has been found that the corner parts are not sufficiently coated.

Figure 4:
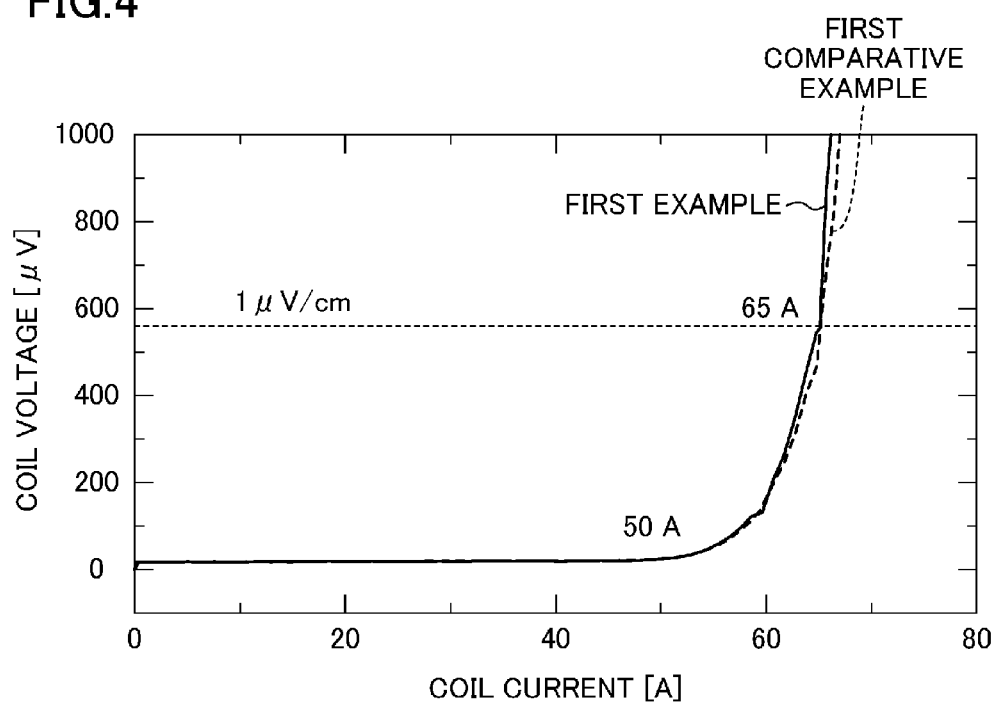
FIG. 4 is a graph illustrating experimental results of a first example and a first comparative example.

FIG. 4 illustrates the V-I characteristics in the first example and the first comparative example. In the first comparative example indicated by a dashed line, normal-conducting voltage begins to increase at about 50 A, and the critical current of the coil corresponding to about 1 $\mu$V/cm is about 65 A. An n-value obtained based on a V-I curve is 20. In the first example indicated by a solid line, there is no change in both of the critical current and the n-value, and the coil properties are not degraded.

(Discussion)

In most cases, in the epoxy-impregnated high-temperature superconducting coil 8, delamination occurs due to application of tensile stress or cleavage stress in a radial direction to the superconducting yttrium-based wire 2, and therefore electrical conductivity is degraded. However, if the coil is configured such that the superconducting yttrium-based wire 2 and the epoxy resin 7 do not directly contact each other and the foregoing stress is reduced, degradation due to epoxy impregnation can be reduced or prevented.

Figure 5:
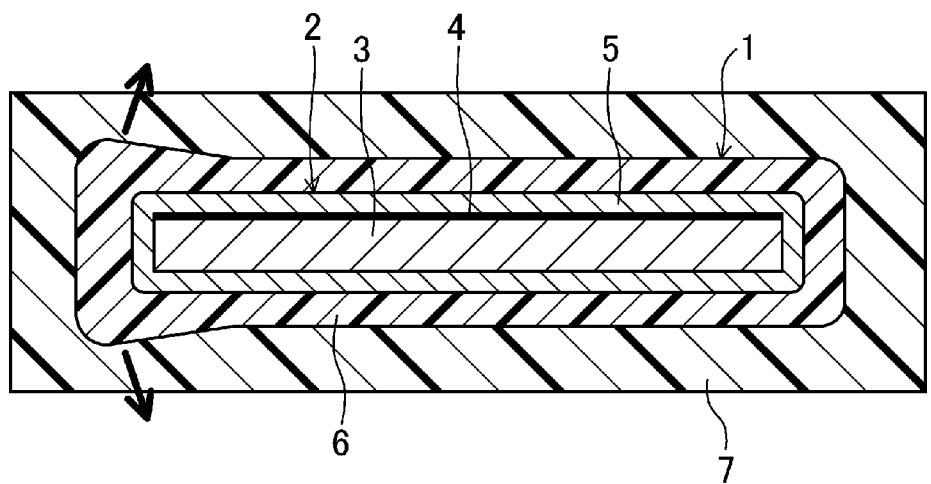
FIG. 5 is an enlarged cross-sectional view illustrating the state in which an insulating layer is elastically deformed by cleavage stress.
Figure 6:
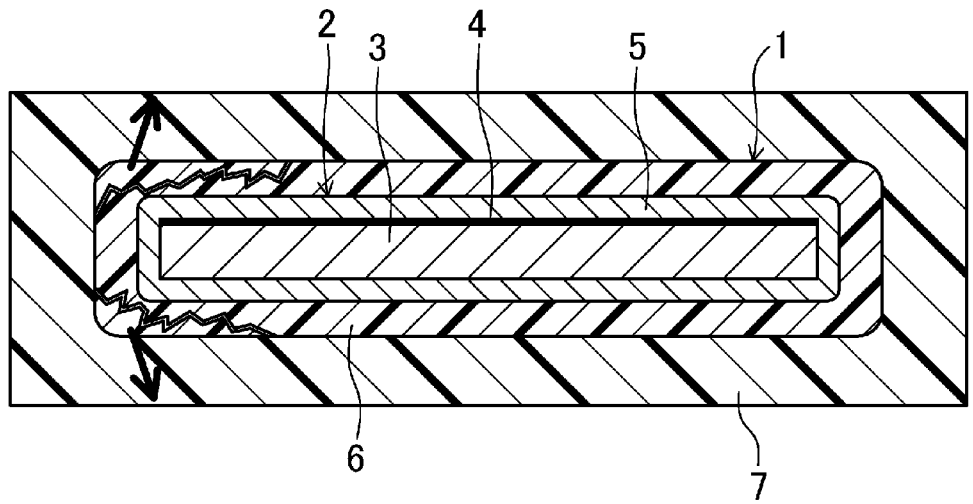
FIG. 6 is an enlarged cross-sectional view illustrating the state in which an insulating layer is cracked by cleavage stress.
Figure 7:
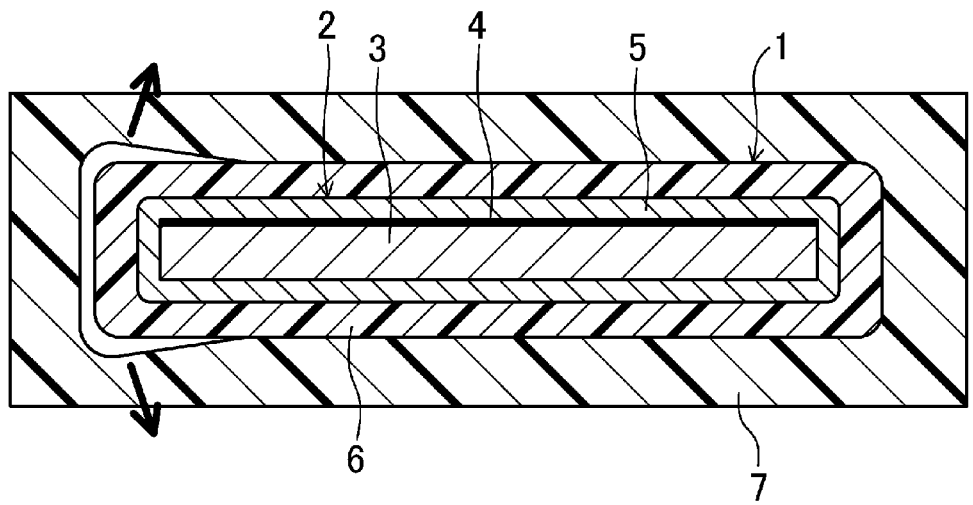
FIG. 7 is an enlarged cross-sectional view illustrating the state in which an impregnation material such as epoxy resin is detached by cleavage stress.

Referring to FIG. 1, since the coated high-temperature superconducting wire 1 of the first example is sufficiently coated even in the corner parts of the superconducting yttrium-based wire 2, the epoxy resin 7 does not directly contact the superconducting yttrium-based wire 2. In addition, polyimide used for the coating film is flexible due to a relatively-low cross-linking ratio of polymer chains and has a relatively-low coating strength. Thus, if there is excessive stress concentration, such polyimide functions to automatically eliminate a stress concentrated part by being elastically deformed. Further, because of an effect of silicon contained in the coating film, the polyimide has relatively-low compatibility with epoxy resin at a surface of the coating film. Of force transmitted between the epoxy resin 7 and the superconducting yttrium-based wire 2, stress caused due to stress concentration on end parts of the wire in a width direction thereof upon, e.g., cooling of the coil is the biggest factor of mechanical damage of the wire. The foregoing coating properties mitigate such concentration, and therefore protects the superconducting yttrium-based wire 2. That is, stress (e.g., cleavage stress) caused on the superconducting yttrium-based wire 2 due to elastic deformation of an insulating layer 6 as illustrated in FIG. 5, partial cracking of an insulating layer 6 as illustrated in FIG. 6, or detachment at an interface between an insulating layer 6 and epoxy resin 7 as illustrated in FIG. 7 is relieved, thereby reducing or preventing delamination.

Referring to FIG. 4, the critical current of the coil (first comparative example) which is not impregnated with the epoxy resin 7 and the critical current of the epoxy-impregnated superconducting coil 8 (first example) are substantially identical. The following were confirmed. By applying the present disclosure, it can be ensured that intrinsic superconducting properties of the superconducting yttrium-based wire 2 are maintained, and the mechanical damage and the coil property degradation due to the epoxy resin 7 are reduced or prevented in the superconducting yttrium-based wire 2 impregnated with the epoxy resin 7.

SECOND EXAMPLE

In a coated high-temperature superconducting wire 1 illustrated in FIG. 1, an insulating layer 6 having a thickness of about 20 $\mu$m was formed on a superconducting yttrium-based wire 2 (SCS4050 manufactured by Super Power Inc.) having a thickness of about 0.1 mm and a width of about 4 mm, and electrical insulation performance was evaluated.

A similar experiment was conducted for a superconducting bismuth-based wire 2' (DI-BSCCO Type HT (CA50) manufactured by Sumitomo Electric Industries, Ltd.) having a thickness of about 0.36 mm and a width of about 4.5 mm.

Figure 12:
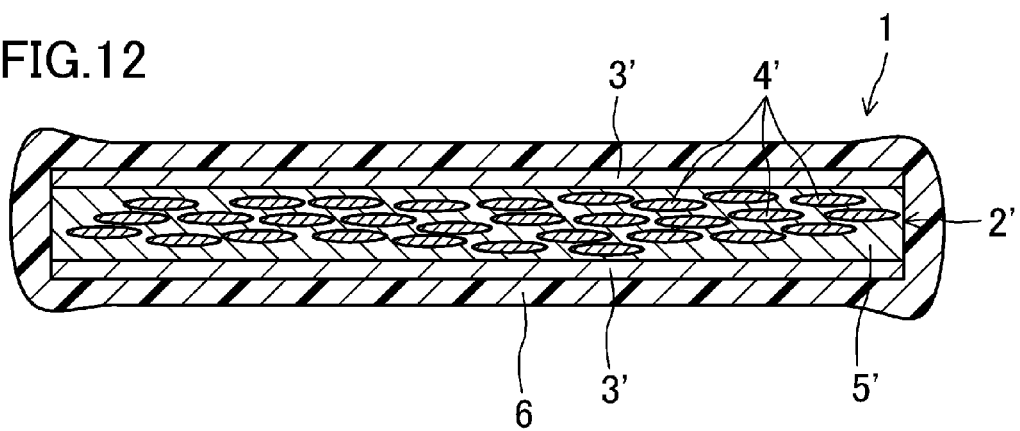
FIG. 12 is an enlarged cross-sectional view schematically illustrating a coated high-temperature superconducting wire including a bismuth-based superconducting wire.

For example, the superconducting bismuth-based wire 2' is formed as follows. Referring to FIG. 12, a sliver tube is filled with raw material powder of a bismuth-based high-temperature superconductor, and then is drawn into a thinner wire. Subsequently, a plurality of such thin wires are further drawn into a single bismuth-based superconductor 4' having a multifilament structure. In the state in which a plurality of bismuth-based superconductors 4' are covered by a silver sheath 5', rolling and sintering are repeated. Then, a reinforcing material 3' made of, e.g., a copper alloy or stainless steel is soldered as necessary. A cross-sectional shape of the superconducting bismuth-based wire 2' is not limited to a shape illustrated in FIG. 12.

The thickness (e.g., about 0.3 mm) of the superconducting bismuth-based wire 2' is greater than that (e.g., about 0.1 mm) of the superconducting yttrium-based wire 2. The allowable bending diameter of the superconducting yttrium-based wire 2 is, e.g., about 11 mm, and the allowable bending diameter of the superconducting bismuth-based wire 2' is, e.g., about 40 mm. The critical current per wire at a temperature of about 4.2 K is much greater in the superconducting yttrium-based wire 2 (about 2000 A) than in the superconducting bismuth-based wire 2' (about 1000 A). The superconducting yttrium-based wire 2 has greater resistance to tension in a longitudinal direction thereof. The allowable tension strength of the superconducting yttrium-based wire 2 is about 500 MPa, and the allowable tension strength of the superconducting bismuth-based wire 2' is about 250 MPa. In each of the superconducting yttrium-based wire 2 and the superconducting bismuth-based wire 2', the critical current per wire at a temperature of about 77 K is about 100-200 A. Thus, the superconducting yttrium-based wire 2 and the superconducting bismuth-based wire 2' are susceptible to stress in a width direction thereof.

(Experimental Results)

For the superconducting yttrium-based wire 2, an insulating layer 6 was formed to a thickness of about 20 μm in a flat part, and was formed to a thickness of about 30 μm in a corner part.

For the superconducting bismuth-based wire 2', an insulating layer 6 was formed to a thickness of about 20 μm in a flat part, and was formed to a thickness of about 35 μm in a corner part.

An insulation breakdown test was performed by a twisted pair method (method according to JIS-C-3003 10.2b), and it was confirmed that the superconducting yttrium-based wire 2 and the superconducting bismuth-based wire 2' have good breakdown voltage of about 5.7-8.0 kV when a coating thickness is about 20 μm. In addition, superconducting performance of both of the superconducting yttrium-based wire 2 and the superconducting bismuth-based wire 2' was not degraded.

THIRD EXAMPLE

Figure 8:
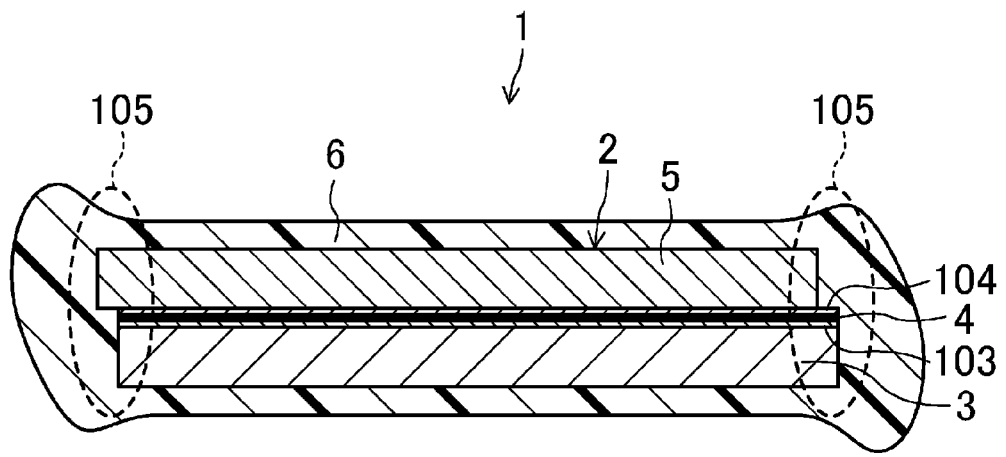
FIG. 8 is an enlarged cross-sectional view schematically illustrating the coated high-temperature superconducting wire.

In the present example, a coated high-temperature superconducting wire 1 is, referring to FIG. 8, configured such that a tape-shaped substrate 3 and a protective layer are bonded together. Specifically, the tape-shaped substrate 3 made of, e.g., hastelloy, a yttrium-based superconductor layer 4 formed on the substrate 3 with an intermediate layer 103 being interposed therebetween, and a protective layer made of, e.g., silver and covering the yttrium-based superconductor layer 4 are stacked on each other. In addition, a stabilization layer 5 made of a stabilizing material such as copper is soldered to upper and lower parts and/or right or left parts of the foregoing stack (by solder 104). Due to manufacturing disadvantages causing non-uniform widths or different positions of the tape-shaped substrate 3 and the stabilization layer 5 or non-uniform solder amount in the coated high-temperature superconducting wire 1, asperities may be formed in a side part 105.

In the present example, an insulating layer 6 was formed to about 10 μm on a superconducting yttrium-based wire 2 (FYSC-SC05 manufactured by Fujikura Ltd.) having a structure in which a hastelloy wire of about 75 μm and a copper wire of about 75 μm are bonded together and having a thickness of about 0.15 mm and a width of about 5 mm, and electrical insulation performance was evaluated.

(Experimental Results)

There was a step of about 70 μm in the side part 105, and the solder 104 leaked and was adhered to the side part 105 so as to be in a hemispherical shape having a diameter of about 20-100 μm. However, the insulating layer 6 was formed to about 30 μm at each of the foregoing corner parts through the use of electrodeposition. In addition, good electrical insulation performance was confirmed. The results shows that a high-adhesive coating film having a sufficient thickness can be formed as the insulating layer 6 of the present disclosure even in a raised-recessed part, and superconductivity is not degraded at all.

FOURTH EXAMPLE AND SECOND COMPARATIVE EXAMPLE

For a coated high-temperature superconducting wire 1 illustrated in FIG. 1, electrodeposition was performed to form an insulating layer 6 to target thicknesses of about 5 μm, about 10 μl, and about 20 μm on a superconducting yttrium-based wire 2 (SCS4050 manufactured by Super Power Inc.) having a thickness of about 0.1 mm and a width of about 4 mm.

In addition, electrodeposition was performed to form an insulating layer 6 to a target thickness of about 20 μm on a superconducting bismuth-based wire 2' (DI-BSCCO Type HT (CA50) manufactured by Sumitomo Electric Industries, Ltd.) having a thickness of about 0.36 mm and a width of about 4.5 mm. Further, electrodeposition was performed to form an insulating layer 6 to a target thickness of about 10 μm on an NbTi wire (K04235050H manufactured by Japan Superconductor Technology Inc.) using as a representative of an LTS wire, formed without an insulating coating film, and having a diameter of about 0.5 mm.

As a second comparative example, dip coating of polyamide-imide varnish (AI-34C manufactured by Totoku Toryo Co., Ltd.) was performed to form an insulating layer 6 to a target thickness of about 30 μm on a superconducting yttrium-based wire 2 (SCS4050 manufactured by Super Power Inc.) having a thickness of about 0.1 mm and a width of about 4 mm and on an NbTi wire (K04235050H manufactured by Japan Superconductor Technology Inc.) using as a representative of an LTS wire, formed without an insulating coating film, and having a diameter of about 0.5 mm.

(Experimental Results)

For the target thickness of about 5 μm, the insulating layer 6 was formed to about 5 μm in a flat part of the superconducting yttrium-based wire 2 and to about 10 μm in a corner part of the superconducting yttrium-based wire 2. For the target thickness of about 10 μm, the insulating layer 6 was formed to about 8 μm in the flat part of the superconducting yttrium-based wire 2 and to about 16 μm in the corner part of the superconducting yttrium-based wire 2. For the target thickness of about 20 μm, the insulating layer 6 was formed to about 19 μm in the flat part of the superconducting yttrium-based wire 2 and to about 28 μm in the corner part of the superconducting yttrium-based wire 2.

For the target thickness of about 20 μm, the insulating layer 6 was formed to about 20 μm in a flat part of the superconducting bismuth-based wire 2' and to about 35 μm in a corner part of the superconducting bismuth-based wire 2'. It was confirmed that each of the foregoing insulating layers 6 is formed without pinholes in not only the flat parts but also the corner parts, and has good electrical insulation performance. For the target thickness of about 10 μm, a polyimide electrodeposited film containing siloxane bonds was formed to about 10 μm around the periphery of the NbTi wire. It was confirmed that no pinholes are formed, and the polyimide electrodeposited film has good electrical insulation performance. In addition, superconducting performance of each of the foregoing wires was not degraded.

On the other hand, in the second comparative example where the superconducting yttrium-based wire was dip-coated by the polyamide-imide varnish, a coating film in a corner part was thinner than that in other part, and a suitable insulating coating film could not be formed. Since there is no corner part in the NbTi wire of the second comparative example, a suitable insulating coating film was formed.

FIFTH EXAMPLE AND THIRD COMPARATIVE EXAMPLE

Figure 9:
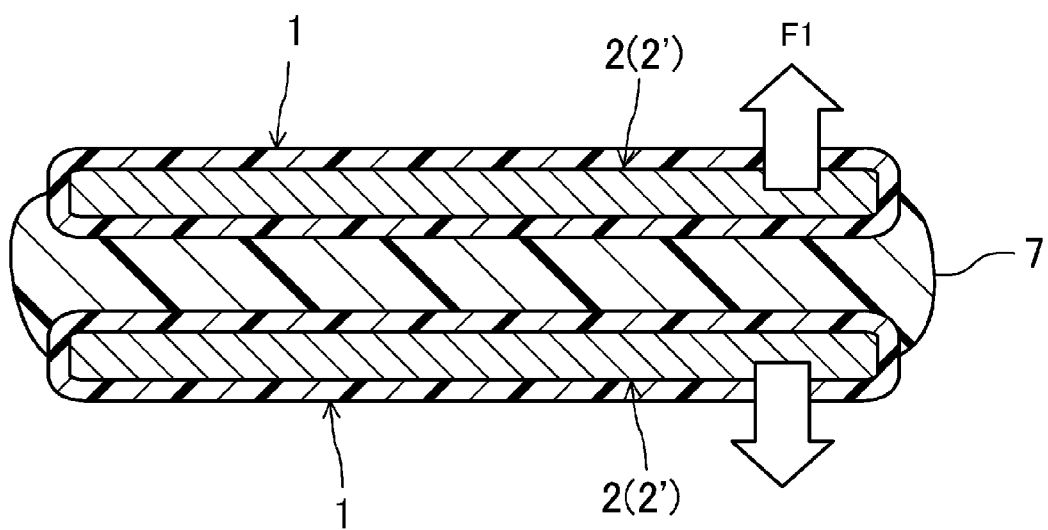
FIG. 9 is an enlarged cross-sectional view schematically illustrating a coated high-temperature superconducting wire of a third example of the present disclosure.

Referring to FIG. 9, two or more coated high-temperature superconducting wires 1 are bonded together by an impregnation material such as epoxy resin 7. Although only two coated high-temperature superconducting wires 1 are illustrated in FIG. 9, a plurality of coated high-temperature superconducting wires 1 may be stacked on each other in the vertical direction, the horizontal direction, or both. The impregnation material such as the epoxy resin 7 may be applied to part of a clearance between the coated high-temperature superconducting wires 1, may be applied to a space sandwiched between the coated high-temperature superconducting wires 1, or may be applied so as to cover the coated high-temperature superconducting wires 1. In addition, the impregnation material such as the epoxy resin 7 may cover each of corner parts of the coated high-temperature superconducting wires 1. The impregnation material such as the epoxy resin 7 may be applied to a clearance between adjacent ones of the plurality of coated high-temperature superconducting wires 1 stacked on each other in the vertical direction, the horizontal direction, or both. The coated high-temperature superconducting wire 1 does not necessarily have a rectangular cross-sectional shape as illustrated in FIG. 9, and may have, e.g., a circular cross section, an oval cross section, a polygonal cross section, and a cross section having an indentation or a recess. The foregoing stack may be bonded to another material such as metal, resin, ceramic, and paper by the impregnation material such as the epoxy resin 7.

In any case, the foregoing cross-sectional structure can be typically observed in, e.g., a superconducting coil, a superconducting cable, a superconducting current lead, and a superconducting current limiter.

Due to, e.g., stress caused by shrinkage or expansion upon curing of the impregnation material such as the epoxy resin 7, thermal stress caused by, e.g., a difference in heat shrinkage rate between the materials upon cool-down to a low temperature, electromagnetic stress caused by, e.g., hoop stress, and stress caused upon formation or curving of, e.g., a superconducting cable, tensile stress or cleavage stress is caused between superconducting wires 2, 2'. In the present disclosure, in order to reduce or prevent degradation of the superconducting wires 2, 2' due to such stress, an insulating layer 6 covers and protects the superconducting wires 2, 2'.

Two for each of the following wires were prepared to perform a cleavage test: superconducting wires 2, 2' (i.e., a superconducting yttrium-based wire 2 and a superconducting bismuth-based wire 2') prepared in the second example and each having a length of about 3 cm; and superconducting wires 2, 2' on each of which an electrodeposited film is not formed. The following three types of superconducting yttrium-based wire 2 (SCS4050 manufactured by Super Power Inc.) having a thickness of about 0.1 mm and a width of about 4 mm were prepared: the superconducting yttrium-based wire 2 on which a polyimide electrodeposited film containing siloxane bonds is formed to about 20 μm; the superconducting yttrium-based wire 2 on which a polyimide electrodeposited film containing no siloxane bond is formed to about 20 μm; and the superconducting yttrium-based wire 2 on which an electrodeposited film is not formed. The following three types of superconducting bismuth-based wire 2' (DI-BSCCO Type HT (CA50) manufactured by Sumitomo Electric Industries, Ltd.) having a thickness of about 0.36 mm and a width of about 4.5 mm were prepared: the superconducting bismuth-based wire 2' on which a polyimide electrodeposited film containing siloxane bonds is formed to about 20 μm; the superconducting bismuth-based wire 2' on which a polyimide electrodeposited film containing no siloxane bond is formed to about 20 μm; and the superconducting bismuth-based wire 2' on which an electrodeposited film is not formed. Two wires were prepared for each of the foregoing types, and each has a length of about 3 cm.

Next, for each of the foregoing wires, electrical conductivity such as a value for critical current $I_c$ and an n-value were measured in liquid nitrogen 17.

Figure 10:
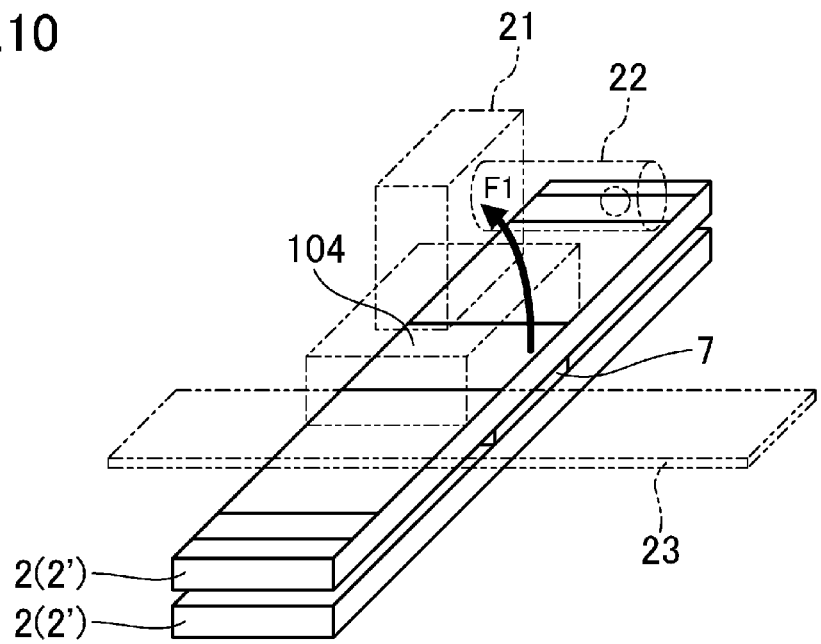
FIG. 10 is a perspective view illustrating a test sample for a cleavage test in a fifth example.

Subsequently, one of the two superconducting wires 2, 2' on which the electrodeposited film is formed was, referring to FIG. 10, soldered to an upper anvil 21 to which tensile stress is to be applied. The other one of the superconducting wires 2, 2' was soldered to a lower anvil 23 to be fixed. A solder-bonded area is about 16 (=4×4) mm².

Subsequently, surfaces of the superconducting wires 2, 2' which are not bonded respectively to the anvils 21, 23 were bonded together by epoxy resin 7 (Stycast 1266 (registered trademark) manufactured by Emerson and Cuming). Grease was applied to a region other than the bonding part such that an epoxy-bonding area is adjusted to about 16 (=4×4) mm². Vacuuming was performed for such a test sample for about 10 minutes to remove air bubbles from the epoxy resin 7. Subsequently, by placing the test sample in an oven set at about 65° C. for about 60 minutes, the epoxy resin 7 was cured. After the curing of the epoxy resin 7, the grease between the superconducting wires 2, 2' was removed.

Figure 11:
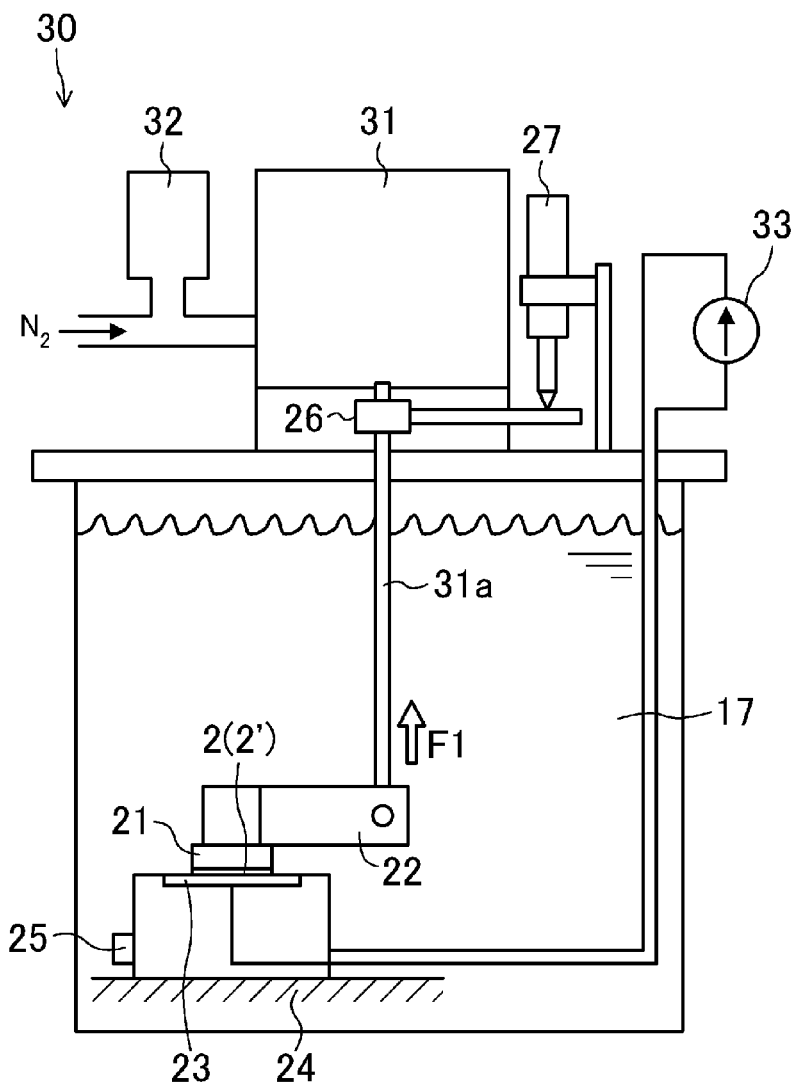
FIG. 11 is a front view illustrating a cleavage test device in the fifth example.

The prepared test sample was set in a tensile testing device 30 illustrated in FIG. 11, and a lever 22 was attached to the upper anvil 21. On the other hand, the lower anvil 23 was attached and fixed to a base 24 made of FRP. The lever 22 was fixed to a rod 31a of a pneumatic cylinder 31. In such a manner that the pneumatic cylinder 31 pulls the lever 22 in the vertical direction, cleavage stress F1 was applied to corner parts of the test sample. An acoustic emission (AE) sensor 25 was attached to the base 24 to measure acoustic wave signals generated in the process of breakdown of the test sample. The tensile force (cleavage stress F1) in the vertical direction was measured by a load cell 26, and displacement in the vertical direction was measured by a displacement gauge 27. In the state in which the test sample is placed in the liquid nitrogen 17, loading and unloading were repeated while gradually increasing a peak value for tensile force (cleavage stress F1). Such a process continued until the test sample was broken down. Subsequently, the electrical conductivity such as a value for $I_c$ and an n-value were measured in the liquid nitrogen 17 by using a DC power source 33. Note that nitrogen gas $N_2$ was supplied through a buffer tank 32. As a third comparative example, a similar test was conducted for the superconducting wires 2, 2' on each of which the electrodeposited film is not formed and the superconducting wires 2, 2' on each of which the polyimide electrodeposited film containing no siloxane bond is formed.

(Experimental Results)

Of the superconducting yttrium-based wires 2, no degradation occurred in the superconducting yttrium-based wire 2 on which the polyimide electrodeposited film containing siloxane bonds is formed. However, in the superconducting yttrium-based wire 2 on which the electrodeposited film is not formed, the value for $I_c$ was reduced to about 64% of the value before impregnation, and the n-value was reduced to about 35% of the value before impregnation. In addition, in the superconducting yttrium-based wire 2 on which the polyimide electrodeposited film containing no siloxane bond is formed, performance thereof was degraded. Of the superconducting bismuth-based wires 2', no degradation occurred in the superconducting bismuth-based wire 2' on which the polyimide electrodeposited film containing siloxane bonds is formed. However, in the superconducting bismuth-based wire 2' on which the electrodeposited film is not formed and the superconducting bismuth-based wire 2' on which the polyimide electrodeposited film containing no siloxane bond is formed, performance thereof were degraded. Thus, although the test continued until the bonding between the superconducting wires 2, 2' was broken by the cleavage stress F1, the performance of the superconducting wires 2, 2' was not degraded because of the polyimide electrodeposited film containing siloxane bonds.

As a result, it can be confirmed that the superconducting wires 2, 2' can be protected from the cleavage stress F1 acting between the superconducting wires 2, 2' due to various factors, by the electrodeposited film of the present disclosure. Such an advantage can be also realized in superconducting wires 2, 2' having thicknesses, widths, and cross-sectional structures other than those of the foregoing superconducting wires 2, 2'. In addition, the foregoing advantage can be also realized in a superconducting wire having a brittle superconducting layer such as an iron-based superconducting layer and a $MgB_2$ superconducting layer.

SIXTH EXAMPLE AND FOURTH COMPARATIVE EXAMPLE

Figure 13:
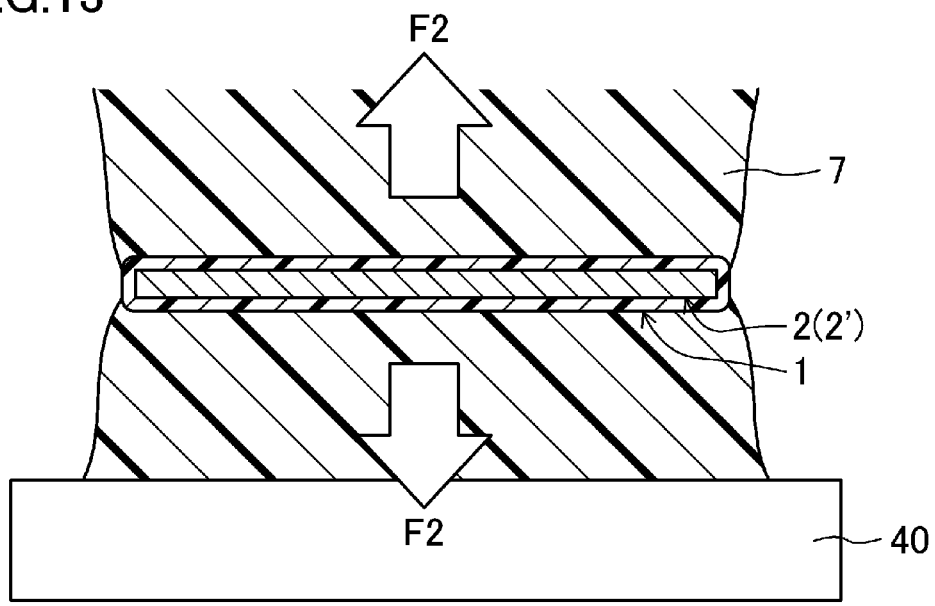
FIG. 13 is an enlarged cross-sectional view illustrating a sixth example.
Figure 14:
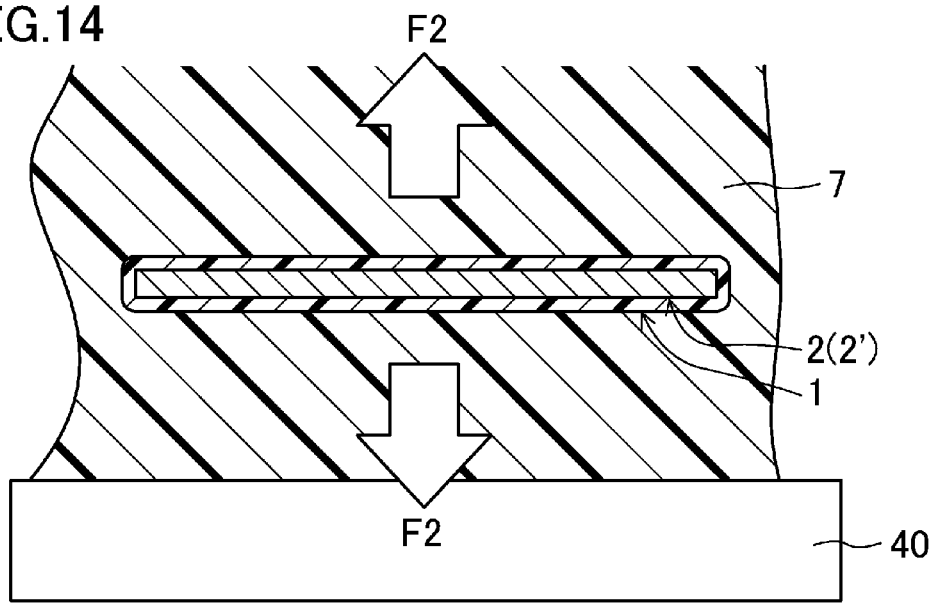
FIG. 14 is another enlarged cross-sectional view illustrating the sixth example.

FIGS. 13 and 14 illustrate a cross section of a superconducting wire 2, 2' of a sixth example (i.e., another embodiment of the present disclosure). Such figures illustrate one or more superconducting wires 2, 2' fixed to a fixed base 40 made of another material such as metal, resin, ceramic, and paper or another superconducting wire 2, 2' by using an impregnation material such as epoxy resin 7. Although only a single superconducting wire 2, 2' is illustrated in FIGS. 13 and 14, a plurality of superconducting wires 2, 2' may be stacked on each other in the vertical direction, the horizontal direction, or both. The impregnation material such as the epoxy resin 7 may cover part or all of the superconducting wires 2, 2' and the fixed base 40. The wire does not necessarily have a rectangular cross-sectional shape as illustrated in FIGS. 13 and 14, and may have, e.g., a circular cross section, an oval cross section, a polygonal cross section, and a cross section having an indentation or a recess. For example, a reel of a superconducting coil and a former of a superconducting cable can be regarded as types of the fixed base 40. In any case, the foregoing cross-sectional structure can be typically observed in, e.g., a superconducting coil, a superconducting cable, a superconducting current lead, and a superconducting current limiter. Due to, e.g., stress caused by shrinkage or expansion upon curing of the impregnation material such as the epoxy resin 7, thermal stress caused by, e.g., a difference in heat shrinkage rate between the materials upon cool-down to a low temperature, electromagnetic stress caused by, e.g., hoop stress, and stress caused upon formation or curving of, e.g., a superconducting cable, wire tensile stress F2 is caused. In the present disclosure, in order to reduce or prevent degradation of the superconducting wires 2, 2' due to such stress, an insulating layer 6 covers and protects the superconducting wires 2, 2'.

The following four types of superconducting yttrium-based wire 2 (SCS4050 manufactured by Super Power Inc.) having a thickness of about 0.1 mm and a width of about 4 mm were prepared: the superconducting yttrium-based wire 2 on which a polyimide electrodeposited film containing siloxane bonds is formed to about 20 μm; the superconducting yttrium-based wire 2 on which a polyimide electrodeposited film containing no siloxane bond is formed to about 20 μm; the superconducting yttrium-based wire 2 on which an acrylic electrodeposited film is formed to about 20 μm; and the superconducting yttrium-based wire 2 on which an electrodeposited film is not formed. The following three types of superconducting bismuth-based wire 2' (DI-BSCCO Type HT (CA50) manufactured by Sumitomo Electric Industries, Ltd.) having a thickness of about 0.36 mm and a width of about 4.5 mm were prepared: the superconducting bismuth-based wire 2' on which a polyimide electrodeposited film containing siloxane bonds is formed to about 20 μm; the superconducting bismuth-based wire 2' on which a polyimide electrodeposited film containing no siloxane bond is formed to about 20 μm; and the superconducting bismuth-based wire 2' on which an electrodeposited film is not formed. Each of the wires has a length of about 6 cm.

First, electrical conductivity such as a value for $I_c$ and an n-value were measured in liquid nitrogen. Subsequently, the following tensile test using such values was performed.

A two-centimeter part of the superconducting wire 2, 2' having a length of 6 cm at the middle thereof was bonded to an aluminum frame 41 by epoxy resin 7 (Stycast 1266 (registered trademark) manufactured by Emerson and Cuming). The aluminum frame 41 is about 18 mm wide, about 12 mm long, and about 1.2 mm high.

Vacuuming was performed for the foregoing test sample for about 10 minutes to remove air bubbles from the epoxy resin 7.

Subsequently, by placing the test sample in an oven set at about 65° C. for about 60 minutes, the epoxy resin 7 was cured.

Figure 15:
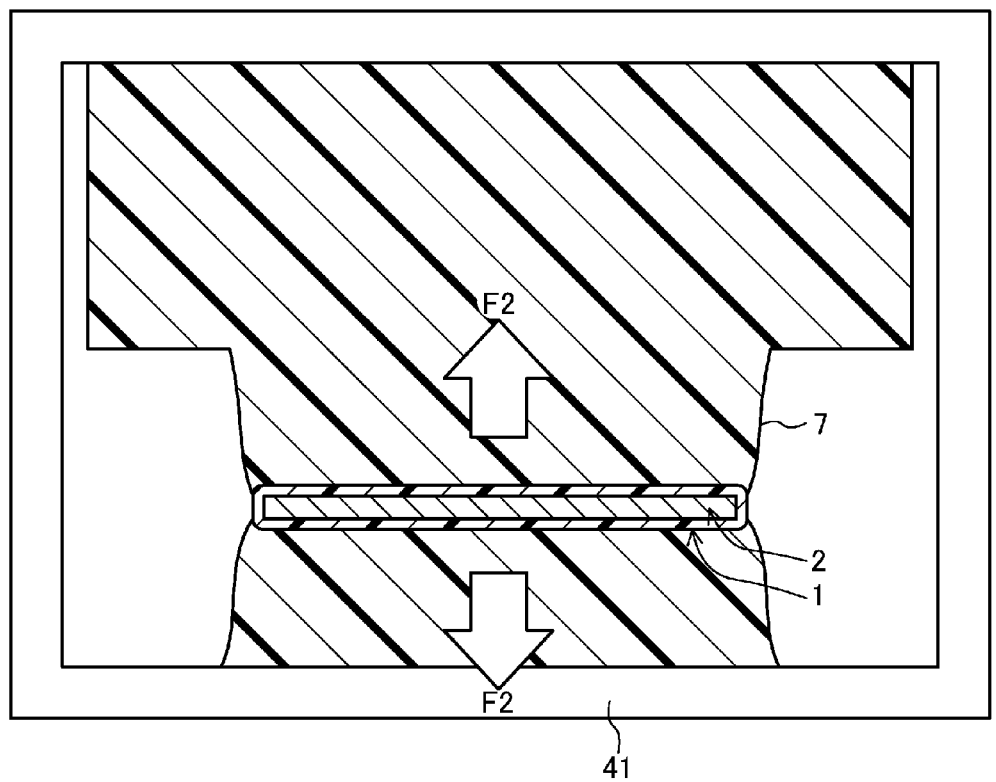
FIG. 15 is an enlarged cross-sectional view illustrating a test method in the sixth example.

Upon curing of the impregnation material such as the epoxy resin 7 or cool-down of the impregnation material to an extremely-low temperature, the impregnation material is more shrunk than other materials. Since the epoxy resin 7 is bonded to upper and lower parts of the aluminum frame 41, tensile stress F2 illustrated in FIG. 15 is applied to the superconducting wire 2, 2'. Such tensile stress F2 is caused due to the difference in heat shrinkage rate between the materials, and a similar phenomenon occurs in, e.g., a superconducting coil, a superconducting cable, a superconducting current lead, and a superconducting current limiter. In the state in which the test sample is under stress due to heat shrinkage caused by cooling the test sample in the liquid nitrogen 17, the electrical conductivity of the superconducting wire 2, 2' such as a value for $I_c$ and an n-value was measured in the liquid nitrogen 17. As a fourth comparative example, a similar test was conducted for the superconducting wires 2, 2' on each of which the electrodeposited film is not formed, the superconducting wires 2, 2' on each of which the polyimide electrodeposited film containing no siloxane bond is formed, and the superconducting yttrium-based wire 2 on which the acrylic electrodeposited film is formed.

(Experimental Results)

Of the superconducting yttrium-based wires 2, in the superconducting yttrium-based wire 2 on which the polyimide electrodeposited film containing siloxane bonds is formed, no change in electrical conductivity such as a value for $I_c$ and an n-value occurred after and before the test, resulting in no degradation. Of the superconducting bismuth-based wires 2', no degradation occurred in the superconducting bismuth-based wire 2' on which the polyimide electrodeposited film containing siloxane bonds is formed On the other hand, in the superconducting yttrium-based wire 2 of the fourth comparative example on which the acrylic electrodeposited film is formed, the value for $I_c$ was, although not specifically illustrated in the figure, reduced to about 14% of the value before impregnation, and the n-value was reduced to about 37% of the value before impregnation. In the superconducting yttrium-based wire 2 on which the electrodeposited film is not formed, the value for $I_c$ was reduced to about 72% of the value before impregnation, and the n-value was reduced to about 63% of the value before impregnation. In addition, in the superconducting yttrium-based wire 2 on which the polyimide electrodeposited film containing no siloxane bond is formed, superconducting performance thereof was degraded.

Of the superconducting bismuth-based wires 2', no degradation occurred in the superconducting bismuth-based wire 2' on which the polyimide electrodeposited film containing siloxane bonds is formed. In the superconducting bismuth-based wire 2' of the fourth comparative example on which the electrodeposited film is not formed and the superconducting bismuth-based wire 2' of the fourth comparative example on which the polyimide electrodeposited film containing no siloxane bond is formed, degradation similarly occurred.

Thus, it can be confirmed that the superconducting wires 2, 2' can be protected from tensile stress acting between the superconducting wires 2, 2' due to various factors, by the insulating layer 6 of the present disclosure. Such an advantage can be also realized in superconducting wires 2, 2' having thicknesses, widths, and cross-sectional structures other than those of the foregoing superconducting wires 2, 2'. In addition, the foregoing advantage can be also realized in a superconducting wire having a brittle superconducting layer such as an iron-based superconducting layer and a $MgB_2$ superconducting layer.

SEVENTH EXAMPLE

As a seventh example, a polyimide electrodeposited film was formed to 20 μm on a superconducting bismuth-based wire 2' (DI-BSCCO Type HT (CA50) manufactured by Sumitomo Electric Industries, Ltd.) having a thickness of about 0.36 mm and a width of about 4.5 mm. The superconducting bismuth-based wire 2' was used to form a double pancake coil (a coil inner diameter of about 80 mm, a coil outer diameter of about 101.6 mm, and a coil height of about 10.8 mm). As a reel 9, a cylinder made of fiber reinforced plastic was used. Before impregnation, it was confirmed by energizing the coil in liquid nitrogen that superconducting properties of the coil are not degraded.

Subsequently, the coil was impregnated with epoxy resin (Stycast 1266 (registered trademark) manufactured by Emerson and Cuming) which is a representative impregnation material, and the epoxy resin was cured. Then, the coil was re-energized in liquid nitrogen. As a result, it was confirmed that no change in critical current and n-value occur, and therefore no property degradation occurs.

EIGHTH EXAMPLE

A superconducting yttrium-based wire 2 was coated by the method illustrated in FIG. 2. The coated high-temperature superconducting wire 1 was used to form a non-impregnated racetrack-shaped coil (a straight-part length of about 80 mm, a coil-end inner diameter of about 80 mm, a coil-end outer diameter of about 87.5 mm, and a coil height of about 4.8 mm) Such a coil was, as a fifth comparative example, energized in liquid nitrogen, and voltage-current (V-I) characteristics were measured. Then, it was confirmed that no degradation occurs.

Subsequently, the coil was impregnated with epoxy resin (Stycast 1266 (registered trademark) manufactured by Emerson and Cuming) which is a representative impregnation material, and the epoxy resin was cured. Then, a high-temperature superconducting coil was formed as an eighth example, and was energized in liquid nitrogen. Consequently, it was confirmed that no degradation occurs due to impregnation.

FIGS. 16-18 illustrate the experimental results of the examples and the comparative examples. As will be seen from the results of the examples, the insulating layer 6 of the present disclosure formed by electrodeposition brings about the state in which bonding strength of the insulating layer 6 to the impregnation material such as the epoxy resin 7 is relatively low due to an effect of siloxane bonds mainly contained in the insulating layer 6. The insulating layer 6 also brings about the state in which the coating film becomes flexible with a relatively-low strength due to both of the effect of siloxane bonds and a relatively-low cross-linking ratio of polymer chains. As a result, the insulating layer 6 functions as a cushion for blocking force transmission between the impregnation material such as the epoxy resin 7 and the superconducting wire 2, 2'. The results show that delamination of the superconducting yttrium-based wire 2 and/or the superconducting bismuth-based wire 2' of the high-temperature superconducting coil can be reduced or prevented regardless of the coil shape, and therefore stable superconducting properties can be obtained. Such an advantage can be also realized in wires having thicknesses, widths, and cross-sectional structures other than those of the foregoing wires. In addition, the foregoing advantage can be also realized in a superconducting wire having a brittle superconducting layer such as an iron-based superconducting layer and a $MgB_2$ superconducting layer.

In the examples where the polyimide containing siloxane bonds, the polyimide containing no siloxane bond, or the acrylic was electrodeposited to various thicknesses on various wires, the results confirm as follows. Electrodeposition improves the stiffness of the superconducting wire, resulting in the elastic wire. Thus, handleability is improved. This decreases the possibility of accidentally degrading, the performance and properties of the superconducting wire extremely susceptible to bending during handling thereof.

Such an advantage can be also realized in wires having thicknesses, widths, and cross-sectional structures other than those of the foregoing wires. In addition, the foregoing advantage can be also realized in any superconducting wire materials having the minimum allowable bending diameter, such as high-temperature superconducting wires made of, e.g., a bismuth-based oxide, an iron-based material, and $MgB_2$ and low-temperature superconducting wires. The wire does not necessarily have a rectangular cross-sectional shape as described above, and may have, e.g., a circular cross section, an oval cross section, a polygonal cross section, and a cross section having an indentation or a recess. In any superconducting wires, the foregoing advantage can be realized by an insulating coating film having at least a thickness which is about 1.5-130% of the wire thickness and more preferably a thickness which is about 5-50% of the wire thickness or by an insulating coating film having at least a thickness of about 1.5-130 μm and more preferably a thickness of about 5-50 μm. Unlike a heat-shrinkable tube and a coating film made of, e.g., formal by dipping, the formed insulating coating film is closely adhered to the superconducting wire, and therefore even the thin insulating coating film can contribute to improvement of the stiffness of the superconducting wire. In addition to the improvement of the stiffness, the electrodeposited film can also function as an electrical insulating film. The improvement of the stiffness can decrease probability of reducing the bending diameter of the superconducting wire to equal to or less than the minimum allowable bending diameter even when unexpected external force acts on the superconducting wire during handling thereof.

As will be seen from the results of the third and fourth examples, the thick electrodeposited film can be formed in the corner parts of the superconducting wire. Thus, features of electrodeposition using polyimide containing siloxane bonds can be effectively utilized for coating of the corner parts of the superconducting wire. That is, the electrodeposited film brings about the state in which the bonding strength of the electrodeposited film to the impregnation material such as the epoxy resin 7 is relatively low due to the effect of siloxane bonds mainly contained in the electrodeposited film. The electrodeposited film also brings about the state in which the coating film becomes flexible with the relatively-low strength due to both of the effect of siloxane bonds and the relatively-low cross-linking ratio of polymer chains. In the corner parts of the superconducting wire, the electrodeposited film more effectively functions as a cushion for blocking force transmission between the impregnation material such as the epoxy resin 7 and the high-temperature superconducting wire. Thus, the thick electrodeposited film formed in the corner parts of the high-temperature superconducting wire can protect the high-temperature superconducting wire from, e.g., stress caused by shrinkage or expansion upon curing of the impregnation material, thermal stress caused by, e.g., a difference in heat shrinkage rate between the materials upon cool-down to a low temperature, electromagnetic stress caused by, e.g., hoop stress, and stress caused upon formation or curving of, e.g., a superconducting cable even when part or all of the high-temperature superconducting wire is impregnated with the impregnation material such as the epoxy resin 7. In particular, this is effective because the corner parts of the high-temperature superconducting wire are susceptible to the cleavage stress F1 and degradation is likely to occur in the corner parts. In the case where, e.g., an insulating coating film made of a coating material (e.g., formal resin coating) for an enamel wire is formed on a long wire, the thickness of the insulating coating film varies in a longitudinal direction of the wire. As in such a case, the thickness of the coating film cannot be precisely controlled. For such a reason, a disadvantage in manufacturing precision upon winding of a wire into a coil arises, and the thickness of the insulating coating film cannot be reduced to the lowest possible thickness considering the variation in thickness.

NINTH EXAMPLE

A superconducting yttrium-based wire 2 (SCS4050 manufactured by Super Power Inc.) having a thickness of about 0.1 mm, a width of about 4 mm, and a length of about 18 m was prepared. Tapes were attached respectively to a starting end and a terminal end of the superconducting yttrium-based wire 2 so that the positions of the starting end and the terminal end can be confirmed, and electrodeposition was performed to form a polyimide film to a target thickness of about 20 μm by using the device illustrated in FIG. 2.

As a result, even the long superconducting yttrium-based wire 2 can be seamlessly and uniformly coated in a longitudinal direction thereof by the electrodeposited film of about 20 μm. In addition, it was confirmed that the outer periphery of the superconducting yttrium-based wire 2 including not only flat parts but also corner parts is satisfactorily coated without pinholes, and the superconducting yttrium-based wire 2 has good electrical insulation performance across the length thereof. Further, performance of the coated superconducting wire were not degraded by processing such as electrodeposition.

(Other Embodiments)

The present disclosure may have the following configurations in the foregoing embodiment.

Although the superconducting yttrium-based wire 2 which is the ReBCO wire has been described as the example of the high-temperature superconducting wire, the present disclosure is not limited to such a wire. The high-temperature superconducting wire may be, e.g., Re 123-type high-temperature superconducting materials containing rare earthes (Re) other than yttrium, bismuth-based oxide high-temperature superconducting materials, and iron-based high-temperature superconducting materials. Examples of Re include elements such as La, Nd, Sm, Eu, Gd, Dy, Ho, Er, Tm, Yb, Lu, and Y. The bottom line is that the effect of the insulating layer 6 of the present disclosure is produced for any high-temperature superconducting wires in which delamination is likely to occur.

Since the coated high-temperature superconducting wire of the present disclosure has excellent mechanical strength, e.g., epoxy resin can be used for hardening of the coated high-temperature superconducting wire. For example, a high-temperature superconducting cable used for superconducting power transmission has the following structure: a superconducting wire is spirally wound around a center conductor called "former" so as to form layers stacked on each other, and an electrical insulating film is wound around and is pressed against the superconducting wire. Since the coated high-temperature superconducting wire of the present disclosure already has high electrical insulation performance, the following structures can be realized: the structure in which an electrical insulating film is not wound around the superconducting wire; and the structure in which an electrical insulating film is wound around the superconducting wire such that the number of turns of the electrical insulating film is reduced. In addition, by using the coated high-temperature superconducting wire of the present disclosure having high electrical insulating properties, the former may be an electrical conducting former, an electrical insulating former, or a thermal conducting former. Further, the former may be bonded to the coated high-temperature superconducting wire, or the structure in which, e.g., a film is wound around and is pressed against the coated high-temperature superconducting wire may be omitted. Since the coated high-temperature superconducting wire is hardened by adhesive, the winding pitch thereof can be increased as compared to that of a conventional superconducting wire, resulting in saving of a wire to be used.

The former to which the coated high-temperature superconducting wire of the present disclosure is bonded may be in a spiral shape or an accordion shape. The coated high-temperature superconducting wire may be bonded to an outside or an inside of the former in accordance with the spiral shape. Alternatively, the former may be in a cylindrical shape, and the coated high-temperature superconducting wire may be bonded to an outside or an inside of such a former. As another alternative, the former may be in a plate shape, and the coated high-temperature superconducting wire may be bonded to one or both sides of such a former. In such a case, the former plate may be turned or twisted such that a bendable direction of the former plate is not only one direction.

Since the electrodeposited film of the coated high-temperature superconducting wire of the present disclosure has high adhesion, the electrodeposited film is less likely to be broken even by rubbing. Thus, the coated high-temperature superconducting wire may be, without the former, simply placed inside a cylinder, an accordion member, or a spiral member. In such a case, the superconducting wire may be turned or twisted such that a bendable direction thereof is not only one direction.

The coated high-temperature superconducting wire used as described above may be used one by one. Alternatively, two or more of the coated high-temperature superconducting wires may be used in combination. In such a case, the coated wires may be bonded together.

In the bonding described above, one or both sides of each coated wire may be impregnated. In addition, the coated wires may be bonded together at part of one side of each coated wire, part of both sides of each coated wire, or ends of the coated wires, or may be bonded together with a clearance. The adhesive is not limited to epoxy resin, and may be, e.g., other curable resin such as phenol resin, paraffin, paraffin wax, wax, grease, and varnish.

Any of the foregoing structures of the superconducting cable may be combined.

The foregoing structures may be employed for a high-temperature superconducting current lead or a high-temperature superconducting current limiter.

By bonding the coated high-temperature superconducting wire to, e.g., the former, the strength of the coated high-temperature superconducting wire against electromagnetic force is increased in the foregoing structures and the use applications. Thus, the coated high-temperature superconducting wires can be used in more close proximity to each other. This reduces the diameter of the superconducting cable. In addition, by bonding the coated high-temperature superconducting wire to the former, the coated high-temperature superconducting wire is applicable to the formers having various structures as described above. The flexible insulating coating film electrodeposited on the coated high-temperature superconducting wire disperses stress (e.g., stress caused upon impregnation and curing of the adhesive, thermal stress, electromagnetic stress, and stress caused upon formation or curving of the superconducting cable) degrading or destroying the performance of the coated high-temperature superconducting wire. Such a feature can reduce or prevent the degradation or destruction of the performance of the coated high-temperature superconducting wire even if the diameter of the superconducting cable is reduced. The reduction in diameter of the superconducting cable results in reduction in installation cost and amount of refrigerant consumption required upon cooling of the coated superconducting wire. This brings about an economic effect. Many superconducting cables may be arranged in the same space. The coated high-temperature superconducting wire used for such a purpose may be made of, e.g., a bismuth-based oxide high-temperature superconducting material or an iron-based high-temperature superconducting material. Even if the aspect ratio of the superconducting wire is at least 5 or more, the foregoing advantages can be realized.

The foregoing embodiment has been set forth merely for the purpose of a preferred example in nature, and is not intended to limit the scope, applications, and use of the present disclosure.

As described above, the present disclosure is useful for the coated high-temperature superconducting wire using the high-temperature superconducting wire, and the high-temperature superconducting coil including the coated high-temperature superconducting wire. In particular, since the present disclosure is applicable not only to a high-temperature superconducting magnet using a high-temperature superconducting coil but also to a high-temperature superconducting cable, a high-temperature superconducting current lead, a high-temperature superconducting current limiter, etc. Thus, it is expected that the present disclosure can widely open a way to a practical use of superconducting power transmission.

What is claimed is:

1. A coated high-temperature superconducting wire comprising:
    a high-temperature superconducting wire covered by an insulating layer,
    wherein:
        the high-temperature superconducting wire has a rectangular cross section, has an aspect ratio of 10 or more, and is made of a superconductor material having a critical temperature equal to or greater than 25 K without any influence of an external magnetic field,
        the high-temperature superconducting wire has a multilayer structure comprising a high-temperature superconducting layer, a tape-shaped metal substrate, an intermediate layer, a protective layer, and a stabilization layer, and
        the insulating layer is an electrodeposited film made of block copolymerized polyimide comprising a siloxane bond in a polyimide main chain and a molecule with an anionic group.

2. The coated high-temperature superconducting wire of claim 1, wherein the multilayer structure comprises:
    the intermediate layer being interposed between the high-temperature superconducting layer and the tape-shaped metal substrate,
    the protective layer being formed on the high-temperature superconducting layer, and
    the stabilization layer being formed around the surface of the layered structure of the high-temperature superconducting layer, the tape-shaped metal substrate, the intermediate layer, and the protective layer.

3. The coated high-temperature superconducting wire of claim 2, wherein the tape-shaped metal substrate is made of nickel or a nickel alloy.

4. The coated high-temperature superconducting wire of claim 2, wherein the stabilization layer is a silver layer.

5. The coated high-temperature superconducting wire of claim 2,
   wherein the stabilization layer comprises a copper layer on a silver layer, and
   wherein the protective layer comprises a layer that is made from a material selected from the group consisting of silver, gold, or an alloy thereof.

6. A high-temperature superconducting coil comprising:
   the coated high-temperature superconducting wire of claim 1.

7. The high-temperature superconducting coil of claim 6, wherein
   the coated high-temperature superconducting wire is wound inside or outside a reel having a predetermined shape, or is wound along a groove of the reel.

8. The high-temperature superconducting coil of claim 7, wherein part or all of the reel is removed.

9. The high-temperature superconducting coil of claim 6, wherein the high-temperature superconducting coil is impregnated with an impregnation material, and the impregnation material comprises cured epoxy.

10. The high-temperature superconducting coil of claim 9, wherein the impregnation material covers the insulating layer, and is completely separated from the high-temperature superconducting wire by the insulating layer.

11. The high-temperature superconducting coil of claim 6, wherein the coated high-temperature superconducting wire is wound inside or outside a cylindrical reel, or is wound along a groove of the cylindrical reel.

12. The high-temperature superconducting coil of claim 6, wherein the coated high-temperature superconducting wire is wound inside or outside a non-cylindrical reel, or is wound along a groove of the non-cylindrical reel.

13. The high-temperature superconducting coil of claim 6, wherein the coated high-temperature superconducting wire is wound inside or outside a reel defining an arc surface in at least part thereof, or is wound along a groove of the reel.

14. The high-temperature superconducting coil of claim 6, wherein a partially-cured resin-impregnated tape is interposed between each adjacent turn of the high-temperature superconducting wire of the high-temperature superconducting coil, and the coil is hardened.

15. The high-temperature superconducting coil of claim 6, wherein a tape is, for insulation, thermal conduction, or detachment, attached to the high-temperature superconducting wire.

16. The high-temperature superconducting coil of claim 6, wherein a material is, for insulation, thermal conduction, or detachment, applied to the high-temperature superconducting wire.

17. The high-temperature superconducting coil of claim 6, wherein a plurality of high-temperature superconducting wires are bonded together.

18. The high-temperature superconducting coil of claim 6, wherein the high-temperature superconducting wire is bonded to a reel or a tape material.

19. The coated high-temperature superconducting wire of claim 1, wherein the insulating layer has a low adhesion to an impregnation material.

20. The coated high-temperature superconducting wire of claim 1, wherein the high-temperature superconducting wire comprises a ReBCO tape.

21. The coated high-temperature superconducting wire of claim 1, wherein the insulating layer substantially uniformly covers part or all of an outer periphery of the high-temperature superconducting wire including a corner part thereof.

22. A coated high-temperature superconducting wire comprising:
   a high-temperature superconducting wire covered by an insulating layer,
   wherein:
      the high-temperature superconducting wire has a rectangular cross section, has a thickness of 0.05 to 1.5 millimeters, and is made of a superconductor material having a critical temperature equal to or greater than 25 K without any influence of an external magnetic field,
      the high-temperature superconducting wire has a multilayer structure comprising an high-temperature superconducting layer, a tape-shaped metal substrate, an intermediate layer, a protective layer, and a stabilization layer, and
      the insulating layer is an electrodeposited film made of block copolymerized polyimide comprising a siloxane bond in a polyimide main chain and a molecule with an anionic group.

23. The coated high-temperature superconducting wire of claim 22, wherein the high-temperature superconducting wire is made of the superconductor material having a width of 2 to 40 millimeters.

24. The coated high-temperature superconducting wire of claim 22, wherein the insulating layer is an electrodeposited film made of block copolymerized polyimide, said polyimide comprising a siloxane bond in a polyimide main chain and a molecule with an anionic group.

25. A high-temperature superconducting coil comprising:
   a coated high-temperature superconducting wire covered by an insulating layer,
   wherein:
      the coated high-temperature superconducting wire has a rectangular cross section, has a thickness of 0.05 to 1.5 millimeters, and is made of a superconductor material having a critical temperature equal to or greater than 25 K without any influence of an external magnetic field,
      the high-temperature superconducting wire has a multilayer structure comprising an high-temperature superconducting layer, a tape-shaped metal substrate, an intermediate layer, a protective layer, and a stabilization layer, and
      the insulating layer is an electrodeposited film made of block copolymerized polyimide comprising a siloxane bond in a polyimide main chain and a molecule with an anionic group.

26. The high-temperature superconducting coil of claim 25, wherein:
   the high-temperature superconducting coil is impregnated with an impregnation material, and the impregnation material is cured,
   the impregnation material covers the insulating layer, and
   the impregnation material is completely separated from the high-temperature superconducting wire by the insulating layer.

\* \* \* \* \*